(12) United States Patent
Tsuda et al.

(10) Patent No.: US 7,761,063 B2
(45) Date of Patent: Jul. 20, 2010

(54) DISTORTION COMPENSATOR AND WIRELESS COMMUNICATION DEVICE

(75) Inventors: Shinichiro Tsuda, Kanagawa (JP); Nishiki Mizusawa, Kanagawa (JP); Tomoari Itagaki, Kanagawa (JP)

(73) Assignees: Sony Corporation, Tokyo (JP); Sony Ericsson Mobile Communications Japan, Inc., Tokyo (JP)

( * ) Notice: Subject to any disclaimer, the term of this patent is extended or adjusted under 35 U.S.C. 154(b) by 498 days.

(21) Appl. No.: 11/775,418

(22) Filed: Jul. 10, 2007

(65) Prior Publication Data
US 2008/0030269 A1    Feb. 7, 2008

(30) Foreign Application Priority Data
Jul. 11, 2006    (JP)    ............................ 2006-190073

(51) Int. Cl.
*H04B 1/04*    (2006.01)
(52) U.S. Cl. .................... 455/114.3; 455/126; 455/260; 375/296; 330/149
(58) Field of Classification Search .............. 455/67.11, 455/67.13, 114.2, 114.3, 115.1, 115.3, 126, 455/127.1, 127.2, 255–260; 375/254, 296; 330/107, 127, 136, 149, 150
See application file for complete search history.

(56) References Cited

U.S. PATENT DOCUMENTS

| | | | |
|---|---|---|---|
| 6,928,272 B2 * | 8/2005 | Doi | .......................... 455/114.2 |
| 7,215,717 B2 * | 5/2007 | Doi | ............................. 375/297 |
| 7,289,776 B2 * | 10/2007 | Matsuoka et al. | ........... 455/126 |
| 7,333,562 B2 * | 2/2008 | Iwasaki | ....................... 375/297 |
| 7,430,248 B2 * | 9/2008 | McCallister | ................. 375/296 |
| 7,469,491 B2 * | 12/2008 | McCallister et al. | ........ 375/296 |

FOREIGN PATENT DOCUMENTS

| | | |
|---|---|---|
| JP | 2004-153558 | 5/2004 |
| JP | 2004-200767 | 7/2004 |

OTHER PUBLICATIONS

N. Mizusawa et al., "Third and Fifth order Base-Band Component Injection for Linearization of the Power Amplifier in a Cellular Phone", IEEE MTT-S International Microwave Symposium Session TH2B-6. (2005).

* cited by examiner

*Primary Examiner*—Nhan Le
(74) *Attorney, Agent, or Firm*—Finnegan, Henderson, Farabow, Garrett & Dunner, L.L.P.

(57) ABSTRACT

A distortion compensator, comprising a distortion component generator that generates a distortion component orthogonal baseband signal corresponding to a nonlinear distortion component based upon an analog orthogonal baseband signal, a distortion component synthesizer that synthesizes a composite signal by combining the analog orthogonal baseband signal and the distortion component orthogonal baseband signal and a first switch through which control is executed as to whether or not to input the distortion component orthogonal baseband signal to the distortion component synthesizer, is provided.

25 Claims, 16 Drawing Sheets

DISTORTION COMPENSATOR AND WIRELESS COMMUNICATION DEVICE

CROSS REFERENCES TO RELATED APPLICATIONS

The present invention contains subject matter related to Japanese Patent Application JP 2006-190073 filed in the Japan Patent Office on Jul. 11, 2006, the entire contents of which are incorporated herein by reference.

BACKGROUND OF THE INVENTION

1. Field of the Invention

The present invention relates to a distortion compensator and a wireless communication device.

2. Description of the Related Art

An amplifier included in a wireless communication device in the related art tends to generate a distortion component in a carrier when it amplifies the transmission power of the carrier. Such a distortion component may cause a disturbance in the reception frequency band of a cellular phone or cause interference from an adjacent channel such as television or the like. For this reason, it is desirable that a power amplifier achieve low-distortion properties, which do not readily allow a distortion component in the carrier.

In addition, technologies such as HSDPA (High Speed Downlink Packet Access) and HSUPA (High Speed Uplink Packet Access) have come to be known as viable technologies to be adopted in the WCDMA (Wideband Code Division Multiple Access) in third generation mobile phone systems. These technologies enable higher-speed communication while using carriers in a single bandwidth.

However, the technologies share properties whereby as a code is multiplexed, the crest factor increases. Due to these properties, the power amplifier is known to degrade the carrier with distortion properties even when transmission is executed with uniform mean power. The distortion properties may be improved by, for instance, increasing the current flowing through the amplifier. At the same time, the various circuits constituting the wireless communication device had better achieve better energy efficiency to assure a sufficient length of drive time on a smallest possible battery. Accordingly, the following distortion compensation techniques are attracting a great deal of interest as techniques to be adopted in power amplifiers to improve the distortion properties of the amplifiers without significantly increasing the power consumption.

The distortion compensation techniques, known today as techniques that may be adopted in a transmitter of a wireless communication device, include a negative feedback technique, a predistortion technique and a feed-forward technique.

The negative feedback technique is a method through which a nonlinear distortion is compensated by feeding back an output signal from the power amplifier as a negative feedback to the input side via a negative feedback circuit. Examples of the negative feedback technique include the Cartesian-loop technique, whereby a feedback signal, broken down into an in-phase component and a quadrature component, is fed back as negative feedback.

The predistortion technique is a method through which a pre-distorted signal component is added to an input signal so as to cancel out a distortion that may occur in the power amplifier. By adopting this method, the nonlinear distortion in the power amplifier can be compensated to a certain extent. For instance, Japanese Patent Application Publication No. JP-A-2004-200767 includes a description of the predistortion technique. Unlike the negative feedback technique, the predistortion technique, in which open-loop control is executed, assures superior stability. However, the pre-distorted signal component had better be optimized in conformance to a parameter that determines the properties of the amplifier.

The feedforward technique is a method in which a distortion component occurring in the power amplifier is detected, the detected distortion component is amplified and then the amplified distortion component is subtracted from an output signal of the power amplifier. As in the predistortion technique, open-loop control is executed in the feedforward technique and thus, the feedforward technique, too, assures superior stability. However, a nonlinear distortion component is generated when amplifying the distortion component and the energy efficiency will be compromised in this technique.

Among these nonlinear distortion compensation methods, the predistortion technique, in particular, assures superior stability and superior energy efficiency. For instance, "2005, IEEE MTT-S International Microwave Symposium Session TH2B-6, Third and Fifth order Base-Band Component Injection for Linearization of the Power amplifier in a Cellular phone" and "Japanese Patent Application Publication No. JP-A-2004-200767" quoted here for reference, both disclose a method through which a third-order component or a fifth-order component of a predistortion signal is generated from an orthogonal baseband signal (an I-component and a Q-component) corresponding to a transmission target signal in the digital part.

SUMMARY OF THE INVENTION

However, when the third-order component or the fifth-order component of the predistortion signal is generated from the orthogonal baseband signal corresponding to the transmission target signal, the predistortion signal had better exclusively occupy a frequency band three times or five times as large as that of the orthogonal baseband signal corresponding to the target signal used as the signal generation source. As a result, when a predistortion signal containing a fifth-order component is generated in the digital part, a digital-analog converter (DAC) capable of processing a signal with a frequency band five times as large as the band of the orthogonal baseband signal corresponding to the target signal is usually used. The use of such a DAC is bound to increase the power consumption so as to assure high speed processing at the DAC and also necessitates additional tasks such as modification of the digital signal processing unit design.

In addition, the distortion compensator disclosed in "Japanese Patent Application Publication No. JP-A-2004-200767" mentioned above is capable of first executing quadrature modulation of the target signal and the predistortion signal separately in different quadrature modulation circuits and then synthesizing a composite signal constituted with the target signal and the predistortion signal having undergone the quadrature modulation. It is desirable that the two different quadrature modulation circuits in this compensator have properties equivalent to each other in order to assure optimal distortion compensation.

However, even when the distortion compensator is equipped with two quadrature modulation circuits assuming identical circuit structures, the properties of the two quadrature modulation circuits are bound to become less uniform as the frequency becomes higher. For this reason, the optimal distortion compensation effect may not be achieved readily by utilizing the distortion compensator in quadrature modulation of the predistortion signal containing the third-order component or the fifth-order component.

Accordingly, the present invention, having been completed by addressing the issues discussed above, provides a new and improved distortion compensator and a new and improved wireless communication device with which the power consumption can be reduced.

According to an embodiment of the present invention, there is provided a distortion compensator capable of compensating for a nonlinear distortion component occurring in the amplification of a target signal that is generated based upon an analog orthogonal base band signal.

The distortion compensator includes a first band-pass filter that limits the frequency band of the analog orthogonal baseband signal input thereto; a distortion component orthogonal baseband signal generator that generates a distortion component orthogonal baseband signal corresponding to the nonlinear distortion component based upon the analog orthogonal baseband signal; an amplitude ratio moderator that moderates an amplitude ratio of the amplitude of the analog orthogonal baseband signal and the amplitude of the distortion component orthogonal baseband signal so as to match the amplitude of the nonlinear distortion component with the amplitude of a signal obtained by amplifying the distortion component orthogonal baseband signal; a phase different moderator that moderates the phase of the distortion component orthogonal baseband signal so as to allow the nonlinear distortion component and the amplified distortion component orthogonal baseband signal to cancel each other out; a distortion component synthesizer that synthesizes a composite signal by combining the analog orthogonal baseband signal and the distortion component orthogonal baseband signal; and a first switch by which control is executed as to whether or not the distortion component orthogonal baseband signal is input to the distortion component synthesizer.

The first band-pass filter included in the distortion compensator may limit the frequency band of the analog orthogonal baseband signal input thereto. In addition, the distortion component orthogonal baseband signal generator may generate the distortion component orthogonal baseband signal corresponding to the nonlinear distortion component based upon the analog orthogonal baseband signal. The amplitude ratio moderator may moderate the amplitude ratio of the amplitude of the analog orthogonal baseband signal and the amplitude of the distortion component orthogonal baseband signal so as to match the amplitude of the nonlinear distortion component with the amplitude of the signal obtained by amplifying the distortion component orthogonal baseband signal. The phase difference moderator may moderate the phase of the distortion component orthogonal baseband signal so as to the nonlinear distortion component and the amplified distortion component orthogonal baseband signal to cancel each other out. The distortion component synthesizer may synthesize a composite signal by combining the analog orthogonal baseband signal and the distortion component orthogonal baseband signal. Control as to whether or not the distortion component orthogonal baseband signal is input to the distortion component synthesizer is executed via the first switch.

The use of the distortion compensator described above enables generation of the distortion component orthogonal baseband signal in the analog part, which, in turn, allows an IP in the related art to be utilized in the digital signal processing unit.

If the output level of the target is low and thus the effect of its nonlinear distortion component is not significant, the input of the distortion component orthogonal baseband signal may be switched off in the distortion compensator so as to reduce power consumption.

The distortion compensator may further include a second band-pass filter that limits the frequency band of the distortion component orthogonal baseband signal having undergone amplitude ratio moderation at the amplitude ratio moderator and having undergone phase moderation at the phase different moderator.

By using the distortion compensator, which includes the second band-pass filter that limits the frequency band of the distortion component orthogonal baseband signal having undergone the amplitude ratio moderation at the amplitude ratio moderator and having undergone the phase moderation at the phase different moderator, out-of-band noise that may have been generated while generating the distortion component orthogonal baseband signal can be reduced in advance.

The distortion compensator may further include a third band-pass filter that limits the frequency band of the target signal generated by the distortion component synthesizer by synthesizing a composite signal composed of the analog orthogonal baseband signal and the distortion component orthogonal baseband signal.

By using the distortion compensator, which includes the third band-pass filter that limits the frequency band of the target signal generated by the distortion component synthesizer by synthesizing a composite signal composed of the analog orthogonal baseband signal and the distortion component orthogonal baseband signal, the out-of-band noise that may have been generated while synthesizing the composite signal by combining the analog orthogonal baseband signal and the distortion component orthogonal signal can be reduced.

The distortion compensator may further include a second switch through which control is executed as to whether or not the analog orthogonal baseband signal is input to the distortion component synthesizer.

By using the distortion compensator, which includes the second switch through which control is executed as to whether or not the analog orthogonal baseband signal is input to the distortion component synthesizer, the signal obtained by amplifying the power for the distortion component orthogonal baseband signal can be measured independently, and thus, moderation parameters for the distortion component orthogonal baseband signal generator, the phase difference moderator and the amplitude ratio moderator can be set with ease.

The distortion compensator may further include a fourth band-pass filter that limits the frequency band of the analog orthogonal baseband signal input to the distortion component synthesizer. In such a distortion compensator, the ON/OFF state of the fourth band-pass filter, instead of the second switch mentioned earlier, may be switched so as to execute control with regard to whether or not the analog orthogonal baseband signal is to be input to the distortion component synthesizer.

By using the distortion compensator which includes the fourth band-pass filter that limits the frequency band of the analog orthogonal baseband signal input to the distortion component synthesizer, out-of-band noise in the analog orthogonal baseband signal can be reduced. Furthermore, any phase delay that may occur between the analog orthogonal baseband signal and the distortion component orthogonal baseband signal can be compensated.

The frequency band of the distortion component orthogonal baseband signal allowed to pass through the second band-pass filter may be variable. Such a distortion compensator, which allows an optimal distortion compensation function to be set within an allowable range for the out-of-band characteristics, can be used effectively in multiband applications.

The frequency band of the analog orthogonal baseband signal is passing through the third band-pass filter may be variable. Such a distortion compensator, which allows an optimal distortion compensation function to be set within an allowable range for the out-of-band noise characteristics, can be used effectively in multiband applications.

The frequency band of the analog orthogonal baseband signal allowed to pass through the fourth band-pass filter may be variable. Such a distortion compensator, which allows an optimal distortion compensation function to be set within an allowable range for the out-of-band noise characteristics, can be used effectively in multiband applications.

The third band-pass filter may alter the passing frequency band by interlocking with an ON/OFF operation at the first switch. Such a distortion compensator allows optimal adjustment of the cutoff frequency at the third band-pass filter when the output signal level does not call for synthesis to be executed by using the distortion component orthogonal baseband signal and thus makes it possible to reduce the adverse effect of the out-of-band noise in an ideal manner.

The fourth band-pass filter may alter the passing frequency band by interlocking with an ON/OFF operation at the first switch. Such a distortion compensator allows optimal adjustment of the cutoff frequency at the fourth band-pass filter when the output signal level does not call for synthesis to be executed by using the distortion component orthogonal baseband signal and thus makes it possible to reduce the adverse effect of the out-of-band noise in an ideal manner.

The second band-pass filter may change the passing frequency band through in correspondence to the amplitude ratio having been moderated at the amplitude ratio moderator. Such a distortion compensator allows optimal adjustment of the cutoff frequency at the second band-pass filter when the output signal level allows the amplitude ratio of the distortion component orthogonal baseband signal to assume a small value and thus makes it possible to reduce the adverse effect of the out-of-band noise in an ideal manner.

The third band-pass filter may change the passing frequency band through in correspondence to the amplitude ratio having been moderated at the amplitude ratio moderator. Such a distortion compensator allows optimal adjustment of the cutoff frequency at the third band-pass filter when the output signal level allows the amplitude ratio of the distortion component orthogonal baseband signal to assume a small value and thus makes it possible to reduce the adverse effect of the out-of-band noise in an ideal manner.

The fourth band-pass filter may change the passing frequency band through in correspondence to the amplitude ratio having been moderated at the amplitude ratio moderator. Such a distortion compensator allows optimal adjustment of the cutoff frequency at the fourth band-pass filter when the output signal level allows the amplitude ratio of the distortion component orthogonal baseband signal to assume a small value and thus makes it possible to reduce the adverse effect of the out-of-band noise in an ideal manner.

According to another embodiment of the present invention, there is provided a distortion compensator capable of compensating for a nonlinear distortion component occurring in the amplification of a target signal that is generated based upon an analog orthogonal base band signal.

The distortion compensator includes a first band-pass filter that limits the frequency band of the analog orthogonal baseband signal input thereto; a distortion component orthogonal baseband signal generator that generates a distortion component orthogonal baseband signal corresponding to the nonlinear distortion component based upon the analog orthogonal baseband signal; an amplitude ratio moderator that moderates an amplitude ratio of the amplitude of the analog orthogonal baseband signal and the amplitude of the distortion component orthogonal baseband signal so as to match the amplitude of the nonlinear distortion component with the amplitude of a signal obtained by amplifying the distortion component orthogonal baseband signal; a phase difference moderator that moderates the phase of the distortion component orthogonal baseband signal so as to allow the nonlinear distortion component and the amplified distortion component orthogonal baseband signal to cancel each other out; a second band-pass filter that limits the frequency band of the distortion component orthogonal baseband signal having undergone amplitude ratio moderation at the amplitude ratio moderator and having undergone phase moderation at the phase difference moderator; and a distortion component synthesizer that synthesizes a composite signal by combining the analog orthogonal baseband signal and the distortion component orthogonal baseband signal.

In the distortion compensator, control with regard to whether or not to input the distortion component orthogonal baseband signal to the distortion component synthesizer may be executed by switching ON/OFF the second band-pass filter.

The first band-pass filter included in the distortion compensator limits the frequency band of the analog orthogonal baseband signal input thereto. In addition, the distortion component orthogonal baseband signal generator generates the distortion component orthogonal baseband signal corresponding to the nonlinear distortion component based upon the analog orthogonal baseband signal. The amplitude ratio moderator moderates the amplitude ratio of the amplitude of the analog orthogonal baseband signal and the amplitude of the distortion component orthogonal baseband signal so as to match the amplitude of the nonlinear distortion component with the amplitude of the signal obtained by amplifying the distortion component orthogonal baseband signal. The phase difference moderator moderates the phase of the distortion component orthogonal baseband signal so as to allow the nonlinear distortion component and the amplified distortion component orthogonal baseband signal to cancel each other out. The second band-pass filter limits the frequency band of the distortion component orthogonal baseband signal having undergone the amplitude ratio moderation at the amplitude ratio moderator and also having undergone the phase moderation at the phase difference moderator. The distortion component synthesizer synthesizes a composite signal by combining the analog orthogonal baseband signal and the distortion component orthogonal baseband signal.

In addition, the control as to whether or not to input the distortion component orthogonal baseband signal to the distortion component synthesizer is executed by switching ON/OFF the second band-pass filter in the distortion compensator.

Since this structure achieves an input switch-over for the distortion component orthogonal baseband signal through the ON/OFF control on the second band-pass filter, it may not include a separate switch to be exclusively utilized for the input switch-over, achieving circuit simplification and providing the distortion compensator as a more compact unit.

The distortion compensator may further include a third band-pass filter that limits the frequency band of the analog orthogonal baseband signal having been combined with the distortion component orthogonal baseband signal at the distortion component synthesizer.

The third band-pass filter limits the frequency band of the analog orthogonal baseband signal having been combined with the distortion component orthogonal baseband signal at the distortion component synthesizer. By using the distortion compensator, which includes the third band-pass filter described above, out-of-band noise that may have been generated while synthesizing the composite signal by combining the analog orthogonal baseband signal and the distortion component orthogonal signal can be reduced.

The distortion compensator may further include a second switch through which control is executed as to whether or not the analog orthogonal baseband signal is input to the distortion component synthesizer.

By using the distortion compensator which includes the second switch through which control is executed as to whether or not the analog orthogonal baseband signal is input to the distortion component synthesizer, the signal obtained by amplifying the power for the distortion component orthogonal baseband signal can be measured independently, and thus, moderation parameters for the distortion component orthogonal baseband signal generator, the phase difference moderator and the amplitude ratio moderator can be set with ease.

The distortion compensator may further include a fourth band-pass filter that limits the frequency band of the analog orthogonal baseband signal input to the distortion component synthesizer.

By using the distortion compensator which includes the fourth band-pass filter that limits the frequency band of the analog orthogonal baseband signal input to the distortion component synthesizer, out-of-band noise in the analog orthogonal baseband signal can be reduced. Furthermore, any phase delay that may occur between the analog orthogonal baseband signal and the distortion component orthogonal baseband signal can be compensated.

The frequency band of the distortion component orthogonal baseband signal allowed to pass through the second band-pass filter may be variable. Such a distortion compensator, which allows an optimal distortion compensation function to be set within an allowable range for the out-of-band noise characteristics, can be used effectively in multiband applications.

The frequency band of the analog orthogonal baseband signal allowed to pass through the third band-pass filter may be variable. Such a distortion compensator, which allows an optimal distortion compensation function to be set within an allowable range for the out-of-band noise characteristics, can be used effectively in multiband applications.

The frequency band of the analog orthogonal baseband signal allowed to pass through the fourth band-pass filter may be variable. Such a distortion compensator, which allows an optimal distortion compensation function to be set within an allowable range for the out-of-band noise characteristics, can be used effectively in multiband applications.

The third band-pass filter may alter the frequency band allowed to pass by interlocking with an ON/OFF operation at the second band-pass filter. Such a distortion compensator allows optimal adjustment of the cutoff frequency at the third band-pass filter when the output signal level does not call for synthesis to be executed by using the distortion component orthogonal baseband signal and thus makes it possible to reduce the adverse effect of the out-of-band noise in an ideal manner.

The fourth band-pass filter may alter the frequency band allowed to pass by interlocking with an ON/OFF operation at the second band-pass filter. Such a distortion compensator allows optimal adjustment of the cutoff frequency at the fourth band-pass filter when the output signal level does not call for synthesis to be executed by using the distortion component orthogonal baseband signal and thus makes it possible to reduce the adverse effect of the out-of-band noise in an ideal manner.

The second band-pass filter may change the frequency band allowed to pass in correspondence to the amplitude ratio having been moderated at the amplitude ratio moderator. Such a distortion compensator allows optimal adjustment of the cutoff frequency at the second band-pass filter when the output signal level allows the amplitude ratio of the distortion component orthogonal baseband signal to assume a small value and thus makes it possible to reduce the adverse effect of the out-of-band noise in an ideal manner.

The third band-pass filter may change the frequency band allowed to pass in correspondence to the amplitude ratio having been moderated at the amplitude ratio moderator. Such a distortion compensator allows optimal adjustment of the cutoff frequency at the third band-pass filter when the output signal level allows the amplitude ratio of the distortion component orthogonal baseband signal to assume a small value and thus makes it possible to reduce the adverse effect of the out-of-band noise in an ideal manner.

The fourth band-pass filter may change the frequency band allowed to pass in correspondence to the amplitude ratio having been moderated at the amplitude ratio moderator. Such a distortion compensator allows optimal adjustment of the cutoff frequency at the fourth band-pass filter when the output signal level allows the amplitude ratio of the distortion component orthogonal baseband signal to assume a small value and thus makes it possible to reduce the adverse effect of the out-of-band noise in an ideal manner.

According to another embodiment of the present invention, there is provided a wireless communication device capable of compensating for a nonlinear distortion component occurring in the amplification of a target signal that is generated based upon an analog orthogonal baseband signal.

The wireless communication device includes a baseband signal generator that generates a digital orthogonal baseband signal; a D-A converter that converts the digital orthogonal baseband signal to the analog orthogonal baseband signal; a first band-pass filter that limits the frequency band of the analog orthogonal baseband signal input thereto; a distortion component orthogonal baseband signal generator that generates a distortion component orthogonal baseband signal corresponding to the nonlinear distortion component based upon the analog orthogonal baseband signal; an amplitude ratio moderator that moderates an amplitude ratio of the amplitude of the analog orthogonal baseband signal and the amplitude of the distortion component orthogonal baseband signal so as to match the amplitude of the nonlinear distortion component with the amplitude of a signal obtained by amplifying the distortion component orthogonal baseband signal; a phase difference moderator that moderates the phase of the distortion component orthogonal baseband signal so as to allow the nonlinear distortion component and the amplified distortion component orthogonal baseband signal to cancel each other out; a distortion component synthesizer that generates the target signal by combining the analog orthogonal baseband signal and the distortion component orthogonal baseband signal; a first switch by which control is executed as whether or not the distortion component orthogonal baseband signal is input to the distortion component synthesizer; a quadrature modulator that executes quadrature modulation on the target signal, a signal amplifier that executes power amplification for the target signal having undergone the quadrature modulation; and a signal transmitter that transmits the target signal having undergone the power amplification.

The baseband signal generator in the wireless communication device generates the digital orthogonal baseband signal. In addition, the D-A converter converts the digital orthogonal baseband signal to the analog orthogonal baseband signal. The first band-pass filter limits the frequency band of the analog orthogonal baseband signal input thereto. The, distortion component orthogonal baseband signal generator generates the distortion component orthogonal baseband signal corresponding to the nonlinear distortion component based upon the analog orthogonal baseband signal. The amplitude ratio moderator moderates the amplitude ratio of the amplitude of the analog orthogonal baseband signal with the amplitude of the distortion component orthogonal baseband signal so as to match the amplitude of the nonlinear distortion component and the amplitude of the signal obtained by amplifying the distortion component orthogonal baseband signal. The phase difference moderator moderates the phase of the distortion component orthogonal baseband signal so as to allow the nonlinear distortion component and the amplified distortion component orthogonal baseband signal to cancel each other out. The distortion component synthesizer generates the target signal by synthesizing a composite signal from the analog orthogonal baseband signal and the distortion component orthogonal baseband signal. Control is executed through the first switch as to whether or not the distortion component orthogonal baseband signal is input to the distortion component synthesizer.

The quadrature modulator executes quadrature modulation on the target signal. The signal amplifier executes power amplification for the target signal having undergone the quadrature modulation. The signal transmitter transmits the target signal having undergone the power amplification.

The wireless communication device, which allows the input of the distortion component orthogonal baseband signal to be switched ON/OFF in correspondence to the output signal level, achieves a reduction in power consumption.

According to another embodiment of the present invention, there is provided a wireless communication device capable of compensating for a nonlinear distortion component occurring in the amplification of a target signal that is generated based upon an analog orthogonal baseband signal.

The wireless communication device includes a baseband signal generator that generates a digital orthogonal baseband signal; a D-A converter that converts the digital orthogonal baseband signal to the analog orthogonal baseband signal; a first band-pass filter that limits the frequency band of the analog orthogonal baseband signal input thereto; a distortion component orthogonal baseband signal generator that generates a distortion component orthogonal baseband signal corresponding to the nonlinear distortion component based upon the analog orthogonal baseband signal; an amplitude ratio moderator that moderates an amplitude ratio of the amplitude of the analog orthogonal baseband signal and the amplitude of the distortion component orthogonal baseband signal so as to match the amplitude of the nonlinear distortion component with the amplitude of a signal obtained by amplifying the distortion component orthogonal baseband signal; a phase difference moderator that moderates the phase of the distortion component orthogonal baseband signal so as to allow the nonlinear distortion component and the amplified distortion component orthogonal baseband signal to cancel each other out; a second band-pass filter that limits the frequency band of the distortion component orthogonal baseband signal having undergone amplitude ratio moderation at the amplitude ratio moderator and also having undergone the phase moderation at the phase difference moderator; a distortion component synthesizer that generates the target signal by combining the analog orthogonal baseband signal and the distortion component orthogonal baseband signal; a quadrature modulator that executes quadrature modulation on the target signal; a signal amplifier that executes power amplification for the target signal having undergone the quadrature modulation; and a signal transmitter that transmits the target signal having undergone the power amplification.

In addition, control as to whether or not to input the distortion component orthogonal baseband signal to the distortion component synthesizer may be executed by switching ON/OFF the second band-pass filter in the wireless communication device.

The baseband signal generator in the wireless communication device generates the digital orthogonal baseband signal. In addition, the D-A converter converts the digital orthogonal baseband signal to the analog orthogonal baseband signal. The first band-pass filter limits the frequency band of the analog orthogonal baseband signal input thereto. The distortion component orthogonal baseband signal generator generates the distortion component orthogonal baseband signal corresponding to the nonlinear distortion component based upon the analog orthogonal baseband signal. The amplitude ratio moderator moderates the amplitude ratio of the amplitude of the analog orthogonal baseband signal and the amplitude of the distortion component orthogonal baseband signal so as to match the amplitude of the nonlinear distortion component with the amplitude of the signal obtained by amplifying the distortion component orthogonal baseband signal. The phase difference moderator moderates the phase of the distortion component orthogonal baseband signal so as to allow the nonlinear distortion component and the amplified distortion component orthogonal baseband signal to cancel each other out. The distortion component synthesizer generates the target signal by synthesizing a composite signal from the analog orthogonal baseband signal and the distortion component orthogonal baseband signal. The second band-pass filter limits the frequency band of the distortion component orthogonal baseband signal having undergone the amplitude ratio moderation at the amplitude ratio moderator and also having undergone the phase moderation at the phase difference moderator, and as it ON/OFF state is switched, control as to whether or not the input the distortion component orthogonal baseband signal to the distortion component synthesizer is executed.

The quadrature modulator executes quadrature modulation on the target signal. The signal amplifier executes power amplification for the target signal having undergone the quadrature modulation. The signal transmitter transmits the target signal having undergone the power amplification.

The wireless communication device, which allows the input of the distortion component orthogonal baseband signal to be switched ON/OFF in correspondence to the output signal level, achieves a reduction in power consumption.

According to the embodiment of the present invention described above, power consumption during the compensation of nonlinear distortion while amplifying a carrier can be reduced.

DETAILED DESCRIPTION OF THE PREFERRED EMBODIMENTS

Figure 1:
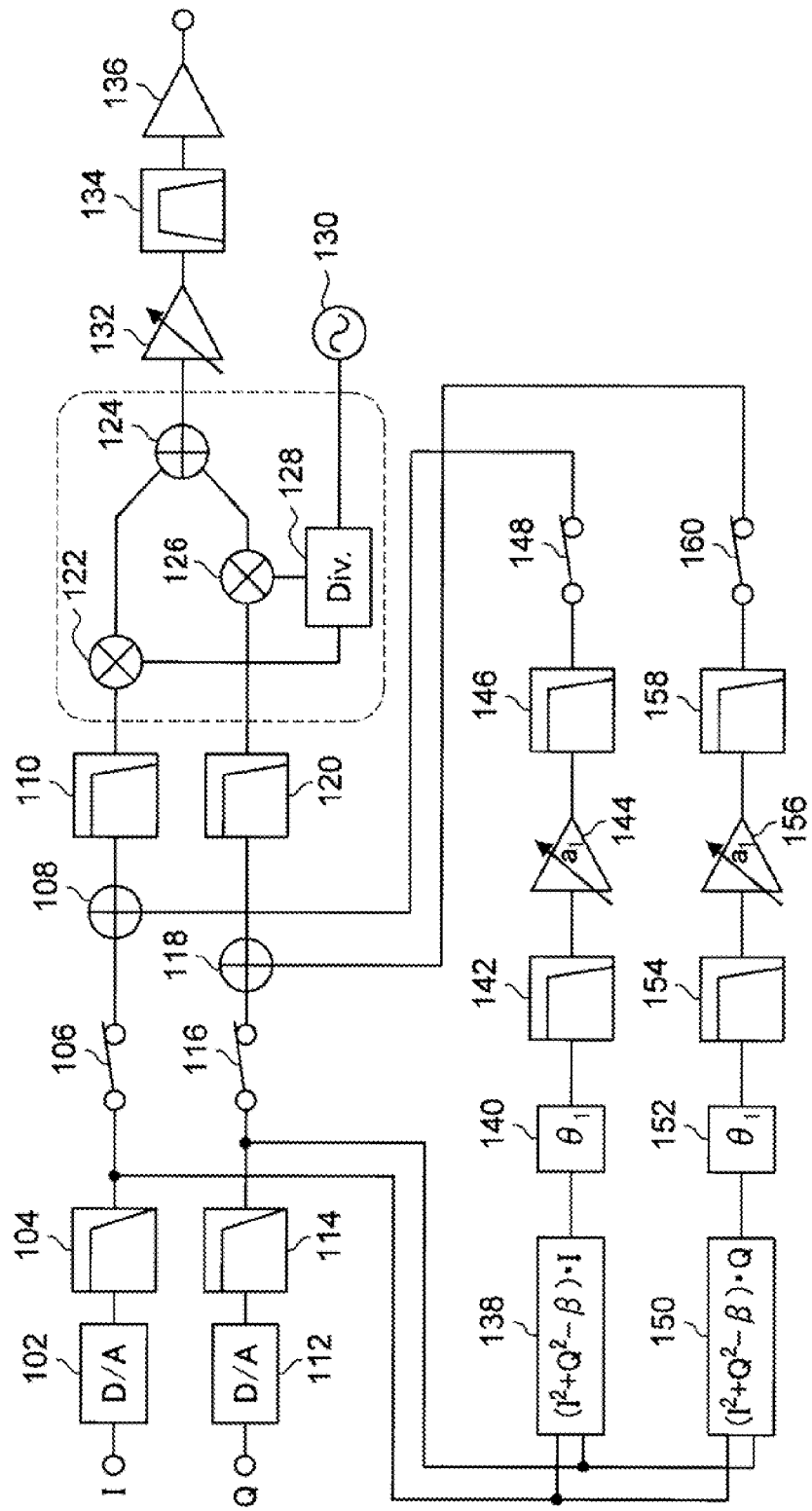
FIG. 1 shows a distortion compensator according to the first embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First Embodiment of the Present Invention

The distortion compensator achieved in the first embodiment of the present invention is now explained. FIG. 1 is a block diagram showing the functional blocks constituting the distortion compensator in the first embodiment. In the distortion compensator achieved in the first embodiment, a digital orthogonal baseband signal (an I-component and a Q-component) having undergone quadrature modulation in a digital part then undergoes distortion compensation in an analog part by adopting a predistortion technique. In addition, the structure adopted in the distortion compensator in the first embodiment allows a decision is made as to whether or not a predistortion signal (or a distortion component orthogonal baseband signal) to be generated or whether or not the signal is to be used in signal synthesis based upon the output signal level or the like.

The digital orthogonal baseband signal (a digital I-component and a digital Q-component) signal having undergone the quadrature modulation in the digital part is then converted to an analog orthogonal baseband signal (an analog I signal (analog I-component) and an analog Q signal (analog Q-component)) at D-A converters 102 and 112. Any out-of-band noise in the analog orthogonal baseband signal is then removed via band-pass filters 104 and 114. In order to simplify the notation, the analog baseband signal is to be referred to as a baseband signal in the following explanation. In addition, in the following explanation, the analog I-component and the analog Q-component, too, are simply referred to as an I-component and a Q-component.

First, in reference to FIG. 1, a predistortion signal generator (or pre-distorter) that generates the predistortion signal to be combined with the baseband signal is described.

The predistortion signal generator includes an I-component predistortion signal generator and a Q-component predistortion signal generator. The I-component predistortion signal generator generates a predistortion signal to be combined with the I-component. In addition, the I-component predistortion signal generator includes an I-component third-order distortion component generator 138 for generating a third-order distortion component in correspondence to the I-component, a phase shifter 140, band-pass filters 142 and 146 and a gain moderator 144.

The I-component third-order distortion component generator 138 is a circuit that generates an $(I^2+Q^2-\beta)*I$-component corresponding to the third-order distortion component in the I-component. It is to be noted that the I-component third-order distortion component generator 138 represents an example of the distortion component orthogonal baseband signal generator.

Now, the $(I^2+Q^2-\beta)*I$-component (and $(I^2+Q^2-\beta)*Q$-component) corresponding to the third-order distortion component in the I-component (and the Q-component) is explained in reference to a simple model of the power amplifier that generates the third-order distortion component. First, with $V_o$ and $V_i$ respectively defined as an output signal voltage and an input signal voltage, an output signal voltage $V_o^{(3)}$ determined by taking into consideration a third-order higher-harmonic wave may be calculated by using a simple model as expressed in Eq. (1) below.

$$V_o^{(3)} = k_1 V_i + k_2 V_i^2 + k_3 V_i^3 \qquad \text{Eq. (1)}$$

Coefficients $k_1$, $k_2$ and $k_3$ and Eq. (1) above are each an arbitrary real constant. In addition, the input signal voltage $V_i$ may be expressed by using a signal amplitude (I) of the I-component and a signal amplitude (Q) of the Q-component perpendicular to each other as in Eq. (2) below.

$$V_i = I \cos\theta - Q \sin\theta \qquad \text{Eq. (2)}$$

It is assumed that the output signal voltage $V_o$, the input signal voltage $V_i$, the amplitude of the I-component, the amplitude of the Q-component and a phase $\theta$ are each a quantity ($=\omega_c t$) that changes over time. By incorporating Eq. (2) for substitution in Eq. (1) and extracting only a fundamental wave component ($\omega_c$) resulting from a higher harmonic wave component removal, the output signal voltage $V_o^{(3)}$ containing the third-order distortion component may be expressed as in Eq. (3) below.

$$V_o^{(3)} = k_1(I\cos\theta - Q\sin\theta) + Ck_3(I^2+Q^2)(I\cos\theta - Q\sin\theta) \qquad \text{Eq. (3)}$$

It is to be noted that C represents a real constant. Namely, the second term in Eq. (3) above corresponds to the third-order distortion component. Accordingly, by generating in advance and synthesizing the $(I^2+Q^2-\beta)*I$-component (and the $(I^2+Q^2-\beta)*Q$-component) corresponding to the third-order distortion component in the I-component (and the Q-component) with the amplitude ratio of (and the phase difference between) $k_1$ and $k_3$ taken into consideration the distortion compensator is able to eliminate the post power amplification third-order distortion component.

The phase shifter 140 moderates the phase component in the I-component predistortion signal so as to cancel out the second term in Eq. (3) representing the third-order distortion component in the I-component. The phase shifter 140, disposed at a stage to the rear of the I-component third-order distortion component generator 138 mentioned earlier, shifts the phase of the I-component predistortion signal component by $\theta_1$ relative to the phase of the I-component. It is to be noted that the phase shifter 140 represents an example of the phase difference moderator.

The band-pass filters 142 and 146 each limit the frequency band of the I-component predistortion signal. The band-pass filter 142, disposed at a stage to the rear of the phase shifter 140, removes a high frequency component from the I-component predistortion signal prior to amplitude modulation. In addition, the band-pass filter 146, disposed at a stage to the rear of the gain moderator 144, removes the high frequency component in the I-component predistortion signal having undergone amplitude ratio moderation. It is to be noted that the band-pass filter 146 represents an example of the second band-pass filter.

The gain moderator 144 moderates the amplitude of the I-component predistortion signal so as to ensure that the value indicating the ratio of the amplitude of the I-component and the amplitude of the I-component predistortion signal corresponds to the ratio of $k_1$ and $k_3$ indicated in Eq. (3). Namely, the gain moderator 144 represents an example of the amplitude ratio moderator.

Figure 16:
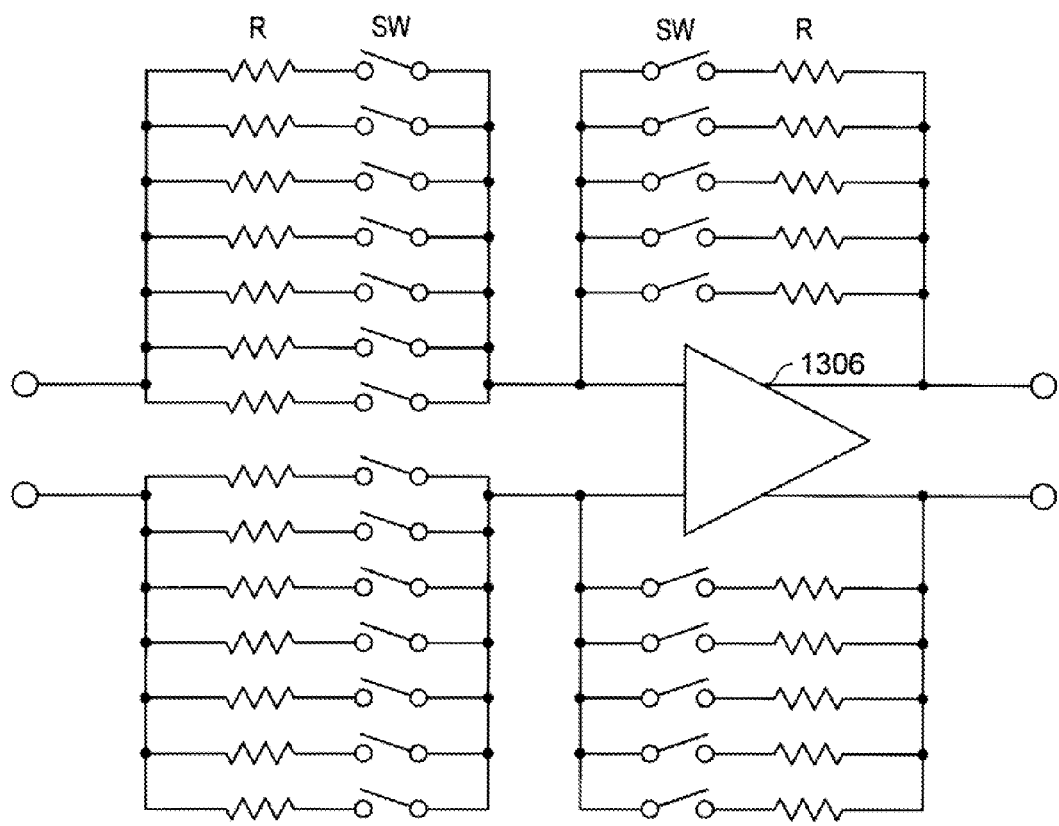
FIG. 16 shows a PGA circuit structure.
Figure 17:
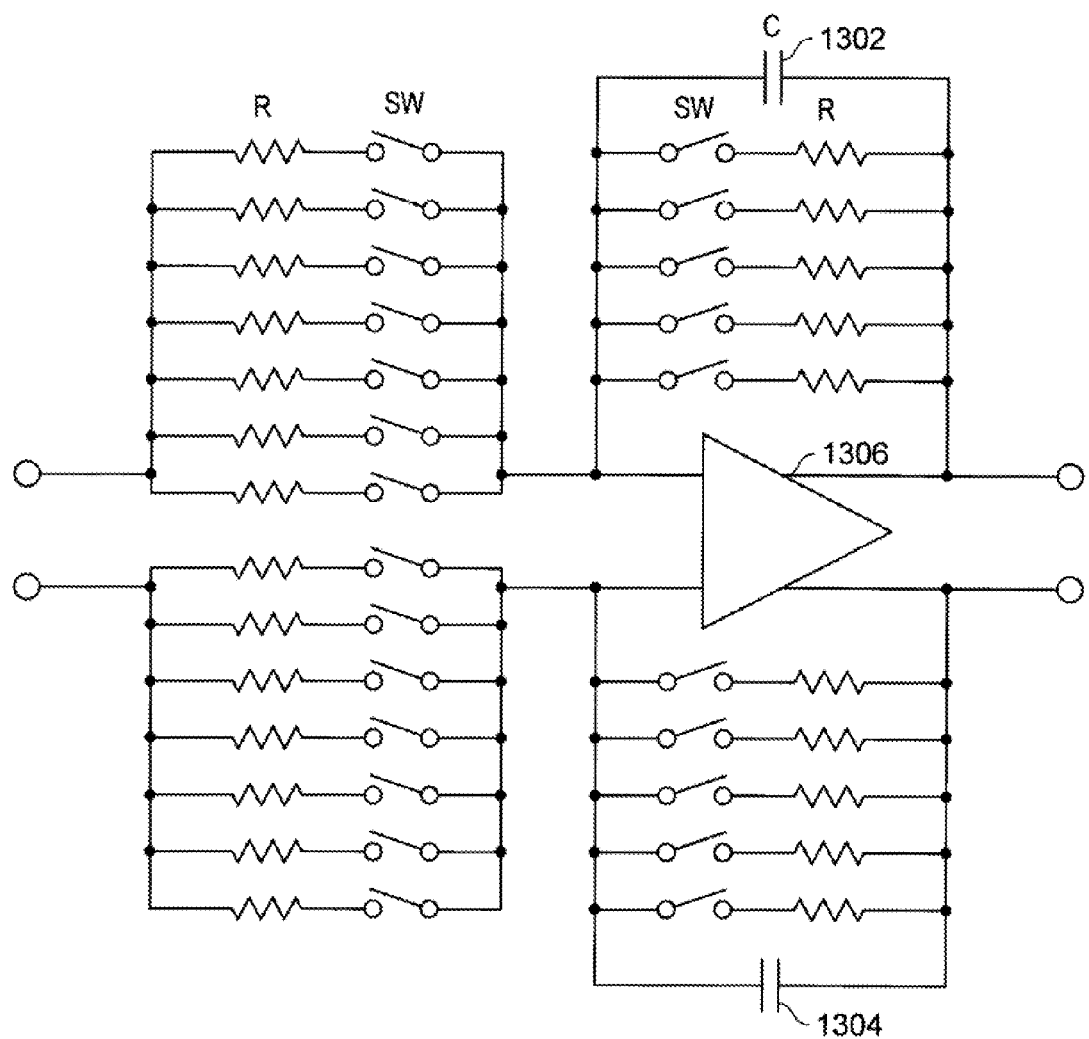
FIG. 17 shows a circuit structure of a PGA having a band-pass filter function.

The gain moderator 144 may be constituted with, for instance, a PGA (Programmable Gain Amplifier) such as that shown in FIG. 16. The PGA in FIG. 16 includes resistors R, switches SW and an operational amplifier 1306. Alternatively, the gain moderator 144 may be constituted with a PGA such as that shown in FIG. 17. The PGA in FIG. 17 includes resistors R, switches SW, an operational amplifier 1306 and capacitors 1302 and 1304. The structure shown in FIG. 17 only differs from that in FIG. 16 in that it includes the capacitors 1302 and 1304. However, the PGA in FIG. 17, equipped with the capacitors 1302 and 1304, has an additional function as a band-pass filter.

The Q-component predistortion signal generator generates a predistortion signal to be combined with the Q-component. The Q-component predistortion signal generator includes a Q-component third-order distortion component generator 150 for generating a third-order distortion component in correspondence to the Q-component, a phase shifter 152, band-pass filters 154 and 158 and a gain moderator 156.

The Q-component third-order distortion component generator 150 is a circuit that generates a $(I^2+Q^2-\beta)*Q$-component corresponding to the third-order distortion component in the Q-component, similar component, similar to the way that the I-component third-order distortion component generator 138 generates the $(I^2+Q^2-\beta)*I$-component. The $(I^2+Q^2-\beta)*Q$-component corresponding to the third-order distortion component in the Q-component has been already described in detail in the explanation of the I-component third-order distortion component generator 138. It is to be noted that the Q-component third-order distortion component generator 150 represents an example of the distortion component orthogonal baseband signal generator.

The phase shifter 152 moderates the phase component in the Q-component predistortion signal so as to cancel out the second term (Q component) in Eq. (3) representing the third-order distortion component, similar to the way that the phase shifter 140 included in the I-component predistortion signal generator described earlier moderates the phase component in the I-component predistortion signal. The phase shifter 152, disposed at a stage to the rear of the Q-component third-order distortion component generator 150 described earlier, shifts the phase of the Q-component predistortion signal component $\theta_1$ relative to the phase of the Q-component. It is to be noted that the phase shifter 152 represents an example of the phase difference moderator.

The band-pass filters 154 and 158 each limit the frequency band of the Q-component predistortion signal, similar to the way that the band-pass filters 142 and 146 included in the I-component predistortion signal generator described earlier limit the frequency band of the I-component predistortion signal. The band-pass filter 154, disposed at a stage to the rear of the phase shifter 152, removes a high frequency component from the Q-component predistortion signal prior to amplitude modulation. In addition, the band-pass filter 158, disposed at a stage to the rear of the gain moderator 156, removes the high frequency component in the Q-component predistortion signal having undergone amplitude ratio moderation. It is to be noted that the band-pass filter 158 represents an example of the second band-pass filter.

The gain moderator 156 moderates the amplitude of the Q-component predistortion signal so as to ensure that the value indicating the ratio of the amplitude of the Q-component and the amplitude of the Q-component predistortion signal corresponds to the ratio of $k_1$ and $k_3$ indicated in Eq. (3). Namely, the gain moderator 156 represents an example of the amplitude ratio moderator. In addition, the gain moderator 156 may be constituted with, for instance, a PGA such as that shown in FIG. 16, by adopting a structure similar to the gain moderator 144 in the I-component predistortion signal generator. Alternatively, the gain moderator 156 may be constituted with a PGA such as that shown in FIG. 17.

The predistortion signal generation process through which the predistortion signals are generated by the predistortion signal generator structured as described above is now briefly explained.

The predistortion signal generation process is now explained. First, the I-component having passed through the band-pass filter 104 and the Q-component having passed through the band-pass filter 114 are input to the I-component third-order distortion component generator 138 where the $(I^2+Q^2-\beta)*I$-component (hereinafter referred to as the I-component third-order distortion component) is generated. The I-component third-order distortion component having been generated by the I-component third-order distortion component generator 138 is then input to the phase shifter 140 where it undergoes a phase shift by an extent $\theta_1$ over the I-Q plane. Any out-of-band noise in the I-component third-order distortion component having undergone the phase shift is removed at the band-pass filter 142. Subsequently, the I-component third-order distortion component is input to the gain moderator 144 at which it undergoes gain moderation so as to achieve a predetermined value for the amplitude ratio of the amplitude of the predistortion signal and the amplitude of the I-component. Any out-of-band noise in the I-component third-order distortion component having undergone the gain moderation is removed at the band-pass filter 146. Through the process described above, the predistortion signal to be combined with the I-component is generated.

Likewise, the I-component having passed through the band-pass filter 104 and the Q-component having passed through the band-pass filter 114 are input to the Q-component third-order distortion component generator 150 where the $(I^2+Q^2-\beta)$*Q-component (hereafter referred to as the Q-component third-order distortion component) is generated. The Q-component third-order distortion component having been generated by the Q-component third-order distortion component generator 150 is then input to the phase shifter 152 where it undergoes a phase shift by an extent $\theta_1$ over the I-Q plane. Any out-of-band noise in the Q-component third-order distortion component having undergone the phase shift is removed at the band-pass filter 154. Subsequently, the Q-component third-order distortion component is input to the gain moderator 156 at which it undergoes gain moderation so as to achieve a predetermined value for the amplitude ratio of the amplitude of the predistortion signal and the amplitude of the Q-component. Any out-of-band noise in the Q-component third-order distortion component having undergone the gain moderation is removed at the band-pass filter 158. Through the process described above, the predistortion signal to be combined with the Q-component is generated.

It is to be noted that the predistortion signals to be combined with the I-component and the Q-component are expressed as in Eq. (4) and Eq. (5) below respectively.

I-component third-order distortion component:

$$(I^2+Q^2-\beta)Ia_1\exp(-j\theta_1) \quad \text{Eq. (4)}$$

Q-component third-order distortion component;

$$(I^2+Q^2-\beta)Qa_1\exp(-j\theta_1) \quad \text{Eq. (5)}$$

It is to be noted that in the expressions presented above, I, Q, $\beta$, $a_1$, j and $\theta_1$ respectively indicate the intensity of the I-component, the intensity of the Q-component, a real constant used in the moderation, a gain moderation value used to moderate the amplitude ratio, an imaginary unit and the phase difference.

It is to be noted that as Eq. (4) clearly indicates, the results of the multiplication of the I-component third-order distortion component, the I-component, the gain moderation value $a_1$ and the phase shift $\theta_1$ are not dependent on their order. Likewise, as Eq. (5) clearly indicates, the results of the multiplication of the Q-component third-order distortion component, the Q-component, the gain moderation value $a_1$ and the phase shift $\theta_1$ are not dependent on their order. This means that the circuit structure described earlier allows their order to be altered.

The predistortion signals are generated through the process described above. The distortion compensator achieved in the first embodiment described above has a function of generating predistortion signals via the predistortion signal generator disposed in the analog part. This structure allows the predistortion signals to be generated, the amplitude ratios to be moderated and the phase difference to be moderated in the analog part. Thus, an IP can be utilized in the digital signal generator disposed at the stage preceding the DACs 102 and 112.

The structural elements included in the distortion compensator in the embodiment, other than the predistortion signal generator, are now explained.

First, the switches 148 and 160 respectively disposed at the stages to the rear of the I-component predistortion signal generator and the Q-component predistortion signal generator are described.

Figure 18:
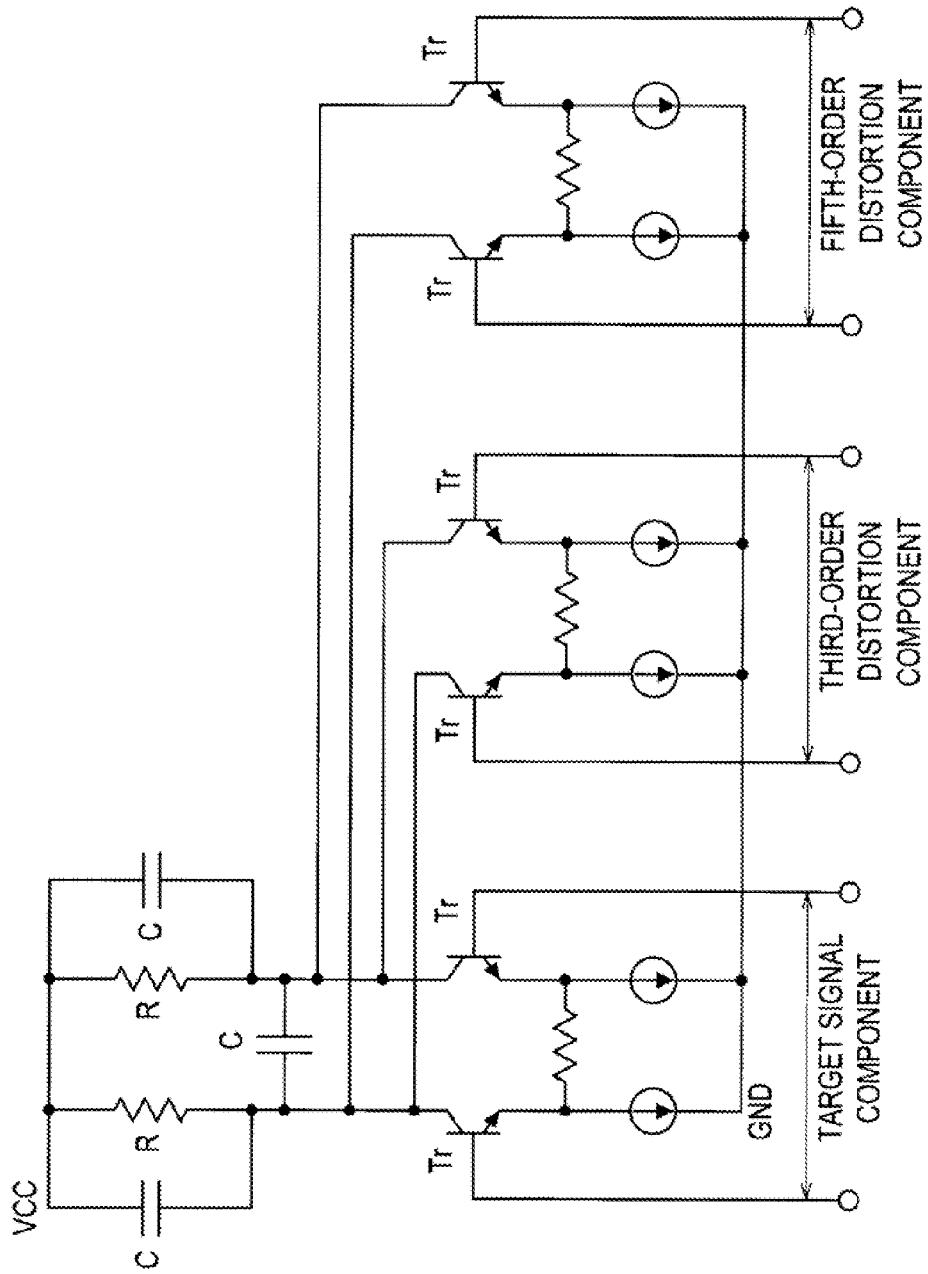
FIG. 18 shows a circuit structure that may be adopted in the adders in the second, fourth, sixth, eighth and tenth embodiments.

The I-component third-order distortion component having been generated at the I-component predistortion signal generator is then combined with the I-component at an adder 108. The adder 108 may adopt a circuit structure such as that shown in FIG. 18. The adder in FIG. 18 includes capacitors C, resistors R and transistors Tr.

The switch 148 is disposed between the band-pass filter 146 constituting part of the I-component predistortion signal generator and the adder 108 in the first embodiment. Control as to whether or not the I-component third-order distortion component is to be added to the I-component can be executed via the switch 148. For instance, if the carrier output is low, the third-order distortion component and higher-order distortion components do not significantly affect other frequency bands as a noise component. In such a case, it is not necessary to employ the adder 108 to synthesize the predistortion signal for removal of higher-order distortion components. Considerable power is to be consumed when generating the predistortion signal, and accordingly, whenever the adverse effect of the higher-order distortion components is not significant, the switch 148 is turned off so as to reduce power consumption.

Likewise, the Q-component third-order distortion component having been generated at the Q-component predistortion signal generator is then combined with the Q-component at the adder 118. The switch 160 is disposed between the band-pass filter 158 constituting part of the Q-component predistortion signal generator and the adder 118. Via the switch 160, control as to whether or not the Q-component third-order distortion component is to be added to the Q-component can be executed. Thus, as is the switch 148, the switch 160 is switched ON/OFF in correspondence to the output signal intensity so as to reduce the power consumption.

By using the switches 148 and 160 through which the predistortion signal input can be switched as described above, the predistortion signal generation can be turned off to minimize the power consumption whenever higher-order distortion compensation does not have to be executed by using the predistortion signals.

Next, the structure adopted in the quadratic modulator is now briefly explained. The quadratic modulator includes multiplexers 122 and 126, an adder 124 and a factor-2 frequency demultiplexer 128. It includes the factor-2 frequency demultiplexer so as to avoid the "pulling phenomenon" in which the degree of modulation is compromised when the carrier frequency of the signal undergoing the quadrature modulation is equal to a local oscillation frequency. Accordingly, the quadratic modulator used in applications in which the pulling phenomenon is not a critical issue does not have to include the factor-2 frequency demultiplexer and, in such a case, the local oscillation frequency may be directly input to the quadratic modulator. In addition, the quadratic modulator is connected to a local oscillator 130. The factor-2 frequency demultiplexer 128 divides the oscillation frequency with which the local oscillator 130 oscillates by a factor of 2 and thus generates local signals for quadrature modulation. The local signals resulting from the frequency division by the factor of 2, to be used in the quadrature modulation are each input to one of the multiplexers 122 and 126, which respectively multiply the I-component and the Q-component by the local signals input thereto. The I-component and the Q-component having been multiplied by the quadrature modulation local signals are synthesized at the adder 124 and the results are then input from the adder to a variable gain moderator 132.

A target signal generated by combining the I-component and the Q-component undergoes power adjustment at the variable gain moderator 132 and the target signal is then input to an inter-stage band-pass filter (BPF) 134. The target signal, with any out-of-band noise contained therein removed at the BPF 134, is input to a power amplifier 136. The predistortion signal component in the target signal is canceled out by a distortion component generated at the power amplifier 136 and thus, the power amplifier 136 provides a target signal containing a smaller distortion component. As the baseband signal generated by synthesizing the predistortion signals undergo quadrature modulation and then is amplified at the power amplifier 136 as described above, the distortion component in the target signal is reduced. It is to be noted that the power amplifier 136 represents an example of the signal amplifier.

Next, the switch 106 disposed between the band-pass filer 104 and the adder 108 and the switch 116 disposed between the band-pass filter 114 and the adder 118 are explained. It is to be noted that the switches 106 and 116 each represent an example of the second switch.

In the distortion compensator achieved in the embodiment, the switch 106 is disposed at the stage preceding the adder 108 and the switch 116 is disposed at the stage preceding the adder 118, so as to allow the predistortion signals to be measured independently. As a result, the settings for the individual structural elements included in the predistortion signal generator can be selected more easily. For instance, with two-tone signals, i.e., the I-component and the Q-component input to the distortion compensator, the third-order distortion component level P3 of the output signal resulting from the power amplification can be measured. Subsequently, the phases and the amplitudes of the predistortion signals can be moderated so as to set the predistortion signal level equal to the third-order distortion component level P3 by turning off the switches 106 and 116.

In the distortion compensator achieved in the first embodiment of the present invention explained above, the predistortion signal generator is disposed at the stage to the rear of the DACs (i.e., in the analog part), which allows an IP to be utilized in the digital signal generator disposed at the stage preceding the DACs. In addition, the distortion compensator includes the distortion component synthesizer (i.e., the adders 108 and 118) disposed at the stage preceding the quadrature modulator, so as to enable a single quadrature modulator to execute quadrature modulation on the target signal generated by combining the analog orthogonal baseband signal and the predistortion signals. As a result, unlike a distortion compensator that includes a plurality of quadrature modulators, which tends to induce characteristics inconsistencies among the individual quadrature modulators, the distortion compensator in the embodiment assures an desirable level of distortion compensation effect.

Furthermore, the distortion compensator includes the switches 148 and 160 through which the predistortion signal input is controlled, disposed at the stages preceding the adders 108 and 118 respectively. Thus, when, for instance, the carrier output is low, the switches 148 and 160 may be turned off to stop the predistortion signal generation so as to eliminate any unnecessary power consumption. In addition, since the inclusion of the switches 106 and 116 in the distortion compensator enables control of the analog orthogonal baseband signal input and allows the predistortion signals alone to be output, the target signal output and the predistortion signal output can be observed and measured independently of each other in the distortion compensator, which facilitates the adjustment of the predistortion signal generator.

It is to be noted that the structure explained above simply represents a preferred embodiment of the present invention, which allows for diverse variations. For instance, the band-pass filters 110 and 120 respectively may adopt a circuit structure with a capacitive component in the loads of the adders 108 and 118. In addition, the band-pass filters 142 and 154 respectively may adopt a circuit structure with a capacitive component in the loads of the phase shifters 140 and 152. Furthermore, the band-pass filters 146 and 158 may adopt a circuit structure with a capacitive component in the loads of the gain moderators 144 and 156.

Second Embodiment of the Present Invention

Figure 2:
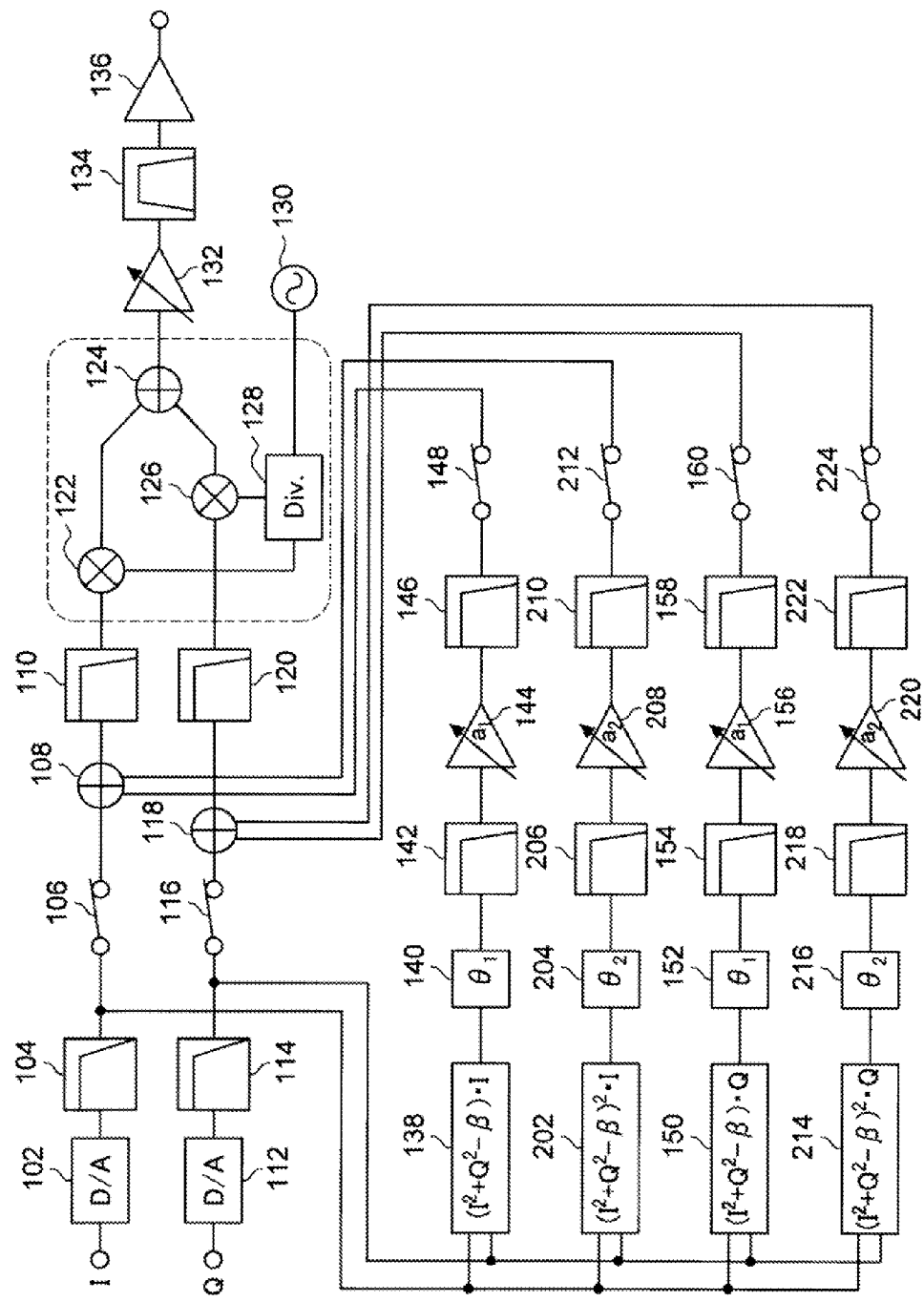
FIG. 2 shows a distortion compensator according to the second embodiment of the present invention.

The distortion compensator achieved in the second embodiment of the present invention is now explained. The same reference numerals are assigned to structural elements identical to those in the distortion compensator in the first embodiment explained earlier so as to preclude the necessity for a repeated explanation thereof and the following detailed explanation focuses on structural elements unique to the second embodiment. FIG. 2 is a block diagram showing the functional blocks constituting the distortion compensator in the second embodiment.

A structural example of a distortion compensator capable of compensating the third-order distortion component is explained in reference to the first embodiment. The second embodiment to be explained here, on the other hand, represents a structural example of a distortion compensator capable of compensating the fifth-order distortion component in addition to the third-order distortion component. Accordingly, the distortion compensator in the second embodiment may achieve a distortion compensation effect with an even higher level of accuracy when, for instance, the signal intensity of the target signal is high.

In reference to FIG. 2, the distortion compensator achieved in the second embodiment is explained. As described earlier, it differs from the distortion compensator in the first embodiment in that it further includes a predistortion signal generator with which the fifth-order distortion component can be compensated.

As shown in FIG. 2, the predistortion signal generator includes additional structural elements, i.e., an I-component fifth-order distortion component generator 202, a Q-component fifth-order distortion component generator 214, phase shifters 204 and 216, band-pass filters 206, 210, 218 and 222 and gain moderators 208 and 220. The following explanation focuses on the I-component fifth-order distortion component generator 202 and the Q-component fifth-order distortion component generator 214.

The I-component fifth-order distortion component generator 202 is a circuit that generates a $(I^2+Q^2-\beta)^*$I-component corresponding to the fifth-order distortion component in the I-component. Likewise, the Quantity-component fifth-order distortion component generator 214 is a circuit that generates a $(I^2+Q^2-\beta)^{2*}$Q-component corresponding to the fifth-order distortion component in the Q-component.

Now, the $(I^2+Q^2-\beta)^{2*}$I-component $(I^2+Q^2-\beta)^{2*}$Q-component corresponding to the fifth-order distortion component in the I-component and the Q-component are explained in reference to a simple model of the power amplifier that generates the fifth-order distortion component. It is to be noted that the model in reference to which the following explanation is provided is achieved by expanding to the fifth-order the model of the power amplifier that generates the third-order distortion component described in reference to the first embodiment. First, with $V_o$ and $V_i$ respectively defined as an output signal voltage and an input signal voltage, an output signal voltage $V_o^{(5)}$ determined by taking into consideration up to the fifth-order higher-harmonic wave may be calculated by using a simple model as expressed in Eq. (6) below.

$$V_o^{(5)} = k_1 V_I + k_2 V_I^2 + k_3 V_I^3 + k_4 V_I^4 + k_5 V_I^5 \qquad \text{Eq. (6)}$$

Coefficients $k_1$, $k_2$, $k_3$, $k_4$ and $k_5$ in Eq. (6) above are each an arbitrary real constant. By incorporating Eq. (2) indicating the analog orthogonal baseband signal for substitution in Eq. (6) and extracting only a fundamental wave component resulting from a higher harmonic wave component removal, the output signal voltage $V_o^{(5)}$ containing the fifth-order distortion component may be expressed as in Eq. (7) below.

$$V_o^{(5)} = V_o^{(3)} + C'k_5(I^2+Q^2)^2(I\cos\theta - Q\sin\theta). \qquad \text{Eq. (7):}$$

It is to be noted that C' represents a real constant. Namely, the second term in Eq. (7) above corresponds to the fifth-order distortion component. Accordingly, by generating in advance and synthesizing the $(I^2+Q^2-\beta)^2*I$-component and the $(I^2+Q^2-\beta)^2*Q$-component corresponding to the fifth-order distortion component in the I-component (and the Q-component) with the amplitude ratio of (and the phase difference between) $k_1$ and $k_5$ taken into consideration, the distortion compensator is able to eliminate the post power amplification fifth-order distortion component.

The phase shifter 204 moderates the phase component in the I-component predistortion signal so as to cancel out the second term in Eq. (7) representing the fifth-order distortion component in the I-component. The phase shifter 204, disposed at a stage to the rear of the I-component fifth-order distortion component generator 202 described earlier, shifts the phase of the I-component predistortion signal component by approximately $\theta_2$ relative to the phase of the I-component. It is to be noted that the phase shifter 204 represents an example of the phase difference moderator.

The band-pass filters 206 and 210 each limit the frequency band of the I-component predistortion signal. In particular, the band-pass filter 206, disposed at a stage to the rear of the phase shifter 204, removes a high frequency component from the I-component predistortion signal prior to amplitude modulation. In addition, the band-pass filter 210, disposed at a stage to the rear of the gain moderator 208, removes the high frequency component in the I-component predistortion signal having undergone amplitude ratio moderation. It is to be noted that the band-pass filter 210 represents an example of the second band-pass filter.

The gain moderator 208 moderates the amplitude of the I-component predistortion signal so as to ensure that the value indicating the ratio of the amplitude of the I-component and the amplitude of the I-component predistortion signal corresponds to the ratio of $k_1$ and $k_5$ indicated in Eq. (7). Namely, the gain moderator 208 represents an example of the amplitude ratio moderator. It is to be noted that the gain moderator 208 may be constituted by using a PGA such as that shown in FIG. 16 or 17.

The phase shifter 216 moderates the phase component in the Q-component predistortion signal so as to cancel out the second term in Eq. (7) representing the fifth-order distortion component in the Q-component. The phase shifter 216, disposed at a stage to the rear of the Q-component fifth-order distortion component generator 214 described earlier, shifts the phase of the Q-component predistortion signal component approximately $\theta_2$ relative to the phase of the Q-component. It is to be noted that the phase shifter 216 represents an example of the phase difference moderator.

The band-pass filters 218 and 222 each limit the frequency band of the Q-component predistortion signal. In particular, the band-pass filter 218, disposed at a stage to the rear of the phase shifter 216, removes a high frequency component from the Q-component predistortion signal prior to amplitude modulation. In addition, the band-pass filter 222, disposed at a stage to the rear of the gain moderator 220, removes the high frequency component in the Q-component predistortion signal having undergone amplitude ratio moderation. It is to be noted that the band-pass filter 222 represents an example of the second band-pass filter.

The gain moderator 220 moderates the amplitude of the Q-component predistortion signal so as to ensure that the value indicating the ratio of the amplitude of the Q-component and the amplitude of the Q-component predistortion signal corresponds to the ratio of $k_1$ and $k_5$ indicated in Eq. (7). Namely, the gain moderator 220 represents an example of the amplitude ratio moderator. It is to be noted that the gain moderator 220 may be constituted by using a PGA such as that shown in FIG. 16 or 17.

Now, the process through which the predistortion signals to be used to compensate the fifth-order distortion component is briefly explained. It is to be noted that since the predistortion signals used to compensate the third-order distortion component are generated through a process similar to that described in reference to the first embodiment, its explanation is omitted.

First, the I-component having passed through the band-pass filter 104 and the Q-component having passed through the band-pass filter 114 are input to the I-component fifth-order distortion component generator 202 where the $(I^2+Q^2-\beta)^2*I$-component (hereafter referred to as the I-component fifth-order distortion component) is generated. The I-component fifth-order distortion component having been generated by the I-component fifth-order distortion component generator 202 is then input to the phase shifter 204 where it undergoes a phase shift by an extent $\theta_2$ over the I-Q plane. Any out-of-band noise in the I-component fifth-order distortion component having undergone the phase shift is removed at the band-pass filter 206. Subsequently, the I-component fifth-order distortion component is input to the gain moderator 208 at which it undergoes gain moderation so as to achieve a predetermined value for the amplitude ratio of the amplitude of the predistortion signal and the amplitude of the I-component. Any out-of-band noise in the I-component fifth-order distortion component having undergone the gain moderation is removed at the band-pass filter 210. Through the process described above, the predistortion signal to be combined with the I-component for purposes of fifth-order component compensation is generated.

Likewise, the I-component having passed through the band-pass filter 104 and the Q-component having passed through the band-pass filter 114 are input to the Q-component fifth-order distortion component generator 214 where the $(I^2+Q^2-\beta)^2*$component (hereafter referred to as the Q-component fifth-order distortion component) is generated. The Q-component fifth-order distortion component having been generated by the Q-component fifth-order distortion component generator 214 is then input to the phase shifter 216 where it undergoes a phase shift by an extent $\theta_2$ over the I-Q plane. Any out-of-band noise in the Q-component fifth-order distortion component having undergone the phase shift is removed at the band-pass filter 218. Subsequently, the Q-component fifth-order distortion component is input to the gain moderator 220 at which it undergoes gain moderation so as to achieve a predetermined value for the amplitude ratio of the amplitude of the predistortion signal and the amplitude of the Q-component. Any out-of-band noise in the Q-component fifth-order distortion component having undergone the gain moderation is removed at the band-pass filter 222. Through the process described above, the predistortion signal to be combined with the Q-component for purposes of fifth-order distortion component compensation is generated.

It is to be noted that the predistortion signals to be combined with the I-component and the Q-component for purposes of fifth-order distortion component compensation are expressed as follows.

I-component fifth-order distortion component;

$$(I^2-Q^2-\beta)^2 Ia_2 \exp(-j\theta_2) \qquad \text{Eq. (8)}$$

Q-component fifth-order distortion component;

$$(I^2-Q^2-\beta)^2 Qa_2 \exp(-j\theta_2) \qquad \text{Eq. (9)}$$

It is to be noted that in the expression presented above, I, Q, $\beta$, $a_2$, j and $\theta_2$ respectively indicate the intensity of the I-component, the intensity of the Q-component, a real constant used in the moderation, a gain moderation value used to moderate the amplitude ratio, an imaginary unit and the phase difference.

The predistortion signal generator used for the fifth-order distortion compensation related to the distortion compensator in the second embodiment assumes the structure described above and generates the predistortion signals through the process described above. As does the distortion compensator in the first embodiment, the distortion compensator in the second embodiment allows for diverse structural variations. For instance, the band-pass filters 206 and 218 respectively may adopt a circuit structure with a capacitive component in the loads of the phase shifters 204 and 216. Furthermore, the band-pass filters 210 and 222 may adopt a circuit structure with a capacitive component in the loads of the gain moderators 208 and 220. In addition, as Eq. (8) clearly indicates, the results of the multiplication of the I-component fifth-order distortion component, the I-component, the gain moderation value $a_2$ and the phase shift $\theta_2$ are not dependent on their order. Likewise, as Eq. (9) clearly indicates, the results of the multiplication of the Q-component fifth-order distortion component, the Q-component, the gain moderation value $a_2$ and the phase shift $\theta_2$ are not dependent on their order. This means that the circuit structure described above allows for modifications by changing the order in which the individual arithmetic processing steps are executed.

Now, the switches 212 and 224 respectively disposed at the stages to the rear of the I-component predistortion signal generator and the Q-component predistortion signal generator are described.

The I-component fifth-order distortion component having been generated at the I-component predistortion signal generator is then combined with the I-component at the adder 108. The switch 212 is disposed between the band-pass filter 210 constituting part of the I-component predistortion signal generator and the adder 108 in the second embodiment. Via the switch 212, control as to whether or not the I-component fifth-order distortion component is to be added to the I-component can be executed. For instance, if the carrier output is low, the fifth-order distortion component and higher-order distortion components do not significantly affect other frequency bands as a noise component. In such a case, the count for synthesizing the predistortion signal for the higher-order distortion component removal is reduced. Considerable power is consumed when generating the predistortion signals, and accordingly, it is desirable to turn off the switch 212 whenever the adverse effect of the higher-order distortion component is not significant, so as to reduce power consumption.

Likewise, the Q-component fifth-order distortion component having been generated at the Q-component predistortion signal generator is then combined with the Q-component at the adder 118. The switch 224 is disposed between the band-pass filter 222 constituting part of the Q-component predistortion signal generator and the adder 118 in the second embodiment. Via the switch 224, control as to whether or not the Q-component fifth-order distortion component is to be added to the Q-component can be executed. Thus, as is the switch 212, the switch 224 is switched ON/OFF in correspondence to the output signal intensity so as to reduce the power consumption.

By using the switches 212 and 224 through which the predistortion signal input can be switched as described above, the predistortion signal generation can be turned off to minimize the power consumption whenever higher-order distortion compensation does not have to be executed by using the predistortion signals.

In addition to the distortion compensation effect achieved by adopting the structure explained in reference to the first embodiment, the distortion compensator in the second embodiment of the present invention structured as described above assures effective compensation even for higher-order distortion. Furthermore, the distortion compensator allows the input of the distortion signals to be used to cancel out the fifth-order distortion components contained in the target signal having undergone the power amplification to be switched ON/OFF. In other words, since the predistortion signal input can be turned off in correspondence to the signal level of the output signals, the power consumption in the distortion compensator can be reduced.

Third Embodiment of the Present Invention

Figure 3:
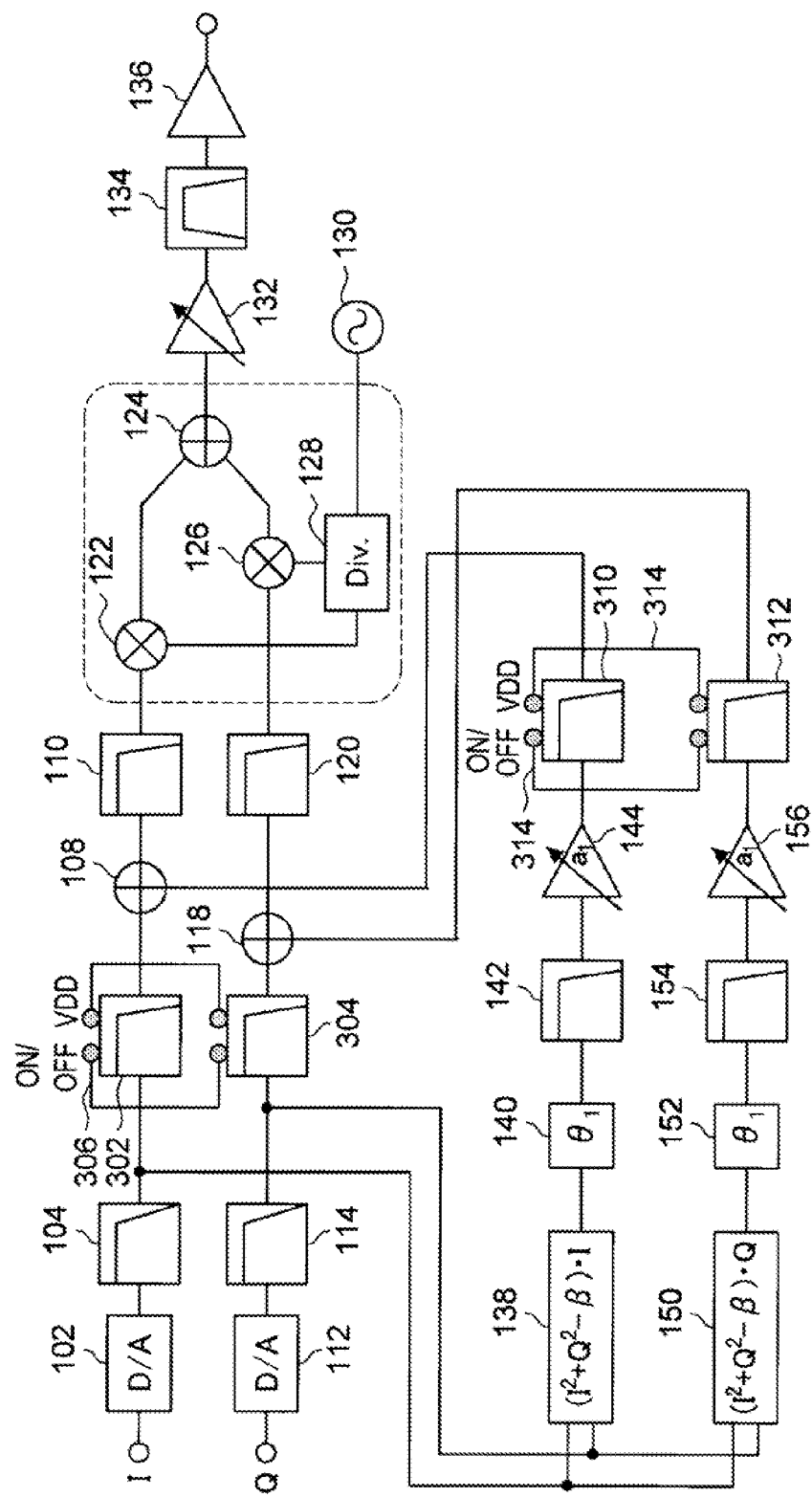
FIG. 3 shows a distortion compensator according to the third embodiment of the present invention.

The distortion compensator achieved in the third embodiment of the present invention is now explained. The same reference numerals are assigned to structural elements identical to those in the distortion compensator in the first embodiment explained earlier so as to preclude the necessity for a repeated explanation thereof and the following detailed explanation focuses on structural elements unique to the third embodiment. FIG. 3 is a block diagram of the distortion compensator achieved in the third embodiment.

The distortion compensator achieved in the first embodiment includes the switches 148 and 160 through which the predistortion signal input control is executed. In addition, the distortion compensator achieved in the first embodiment includes the switches 106 and 116 through which the analog orthogonal baseband signal input control is executed and thus, allows the output signals obtained by executing power amplification of the predistortion signals to be measured independently. In the distortion compensator achieved in the third embodiment of the present invention, on the other hand, active band-pass filters enabling ON/OFF control are used in place of the switches 148, 160, 106 and 116 in the distortion compensator in the first embodiment.

As shown in FIG. 3, the distortion compensator in the third embodiment includes band-pass filters 302 and 304 respectively in place of the switches 106 and 116 in the distortion compensator achieved in the first embodiment (see FIG. 1). Likewise, it includes band-pass filters 310 and 312 respectively in place of the switches 148 and 160.

A control unit 306 controls the ON/OFF states of the band-pass filters 302 and 304 and they are switched ON/OFF in response to a control signal PD1. The control unit 306 executes control in response to the control signal (PD1) so as to set the bias current flowing through the band-pass filters 302 and 304 to zero when the band-pass filters 302 and 304 are in an OFF state. Thus, the band-pass filters 302 and 304 are able to execute operation equivalent to the ON/OFF operation at the switches 106 and 116. Likewise, the band-pass filters 310 and 312 are able to execute operation equivalent to the ON/OFF operation at the switches 148 and 160 as the bias current flowing through them is controlled in response to a control signal (PD2).

In the distortion compensator in the third embodiment adopting the structure described above, the control for the predistortion signals input and the control for the analog orthogonal baseband signal input can be realized by using the band-pass filters 302, 304, 310 and 312, and thus, functions equivalent to those of the distortion compensator in the first embodiment can be provided in the distortion compensator in the third embodiment as well. Since this structure does not include switch circuits, the circuit structure is simplified and the distortion compensator can be provided as a more compact unit. It is to be noted that the structure adopted in the distortion compensator in the third embodiment is not merely an alternative to that of the distortion compensator in the first embodiment. For instance, the distortion compensator in the third embodiment is capable of equalizing the phase delays of the analog orthogonal baseband signals and the predistortion signal at the stages preceding the adders 108 and 118 based upon the phase delays occurring at the band-pass filters 302, 304, 310 and 312. Since this makes it possible to compensate the phase delay occurring in the predistortion signal generator, an even more desirable distortion compensation function is realized.

An explanation has been given above on the structure adopted in the distortion compensator in the third embodiment by focusing on its differences from the distortion compensator in the first embodiment. Moreover, the structure that includes active band-pass filters replacing the switches 148 and 160 and the switches 106 and 116, disposed at the stages preceding the adders 108 and 118 in the distortion compensator in the first embodiment respectively for predistortion input control and analog orthogonal baseband signal input control, has been explained. However, the distortion compensator in the third embodiment is not limited to this structural example. For instance, buffer circuits that utilize operational amplifiers and the like may be used instead of the active band-pass filters.

Fourth Embodiment of the Present Invention

Figure 4:
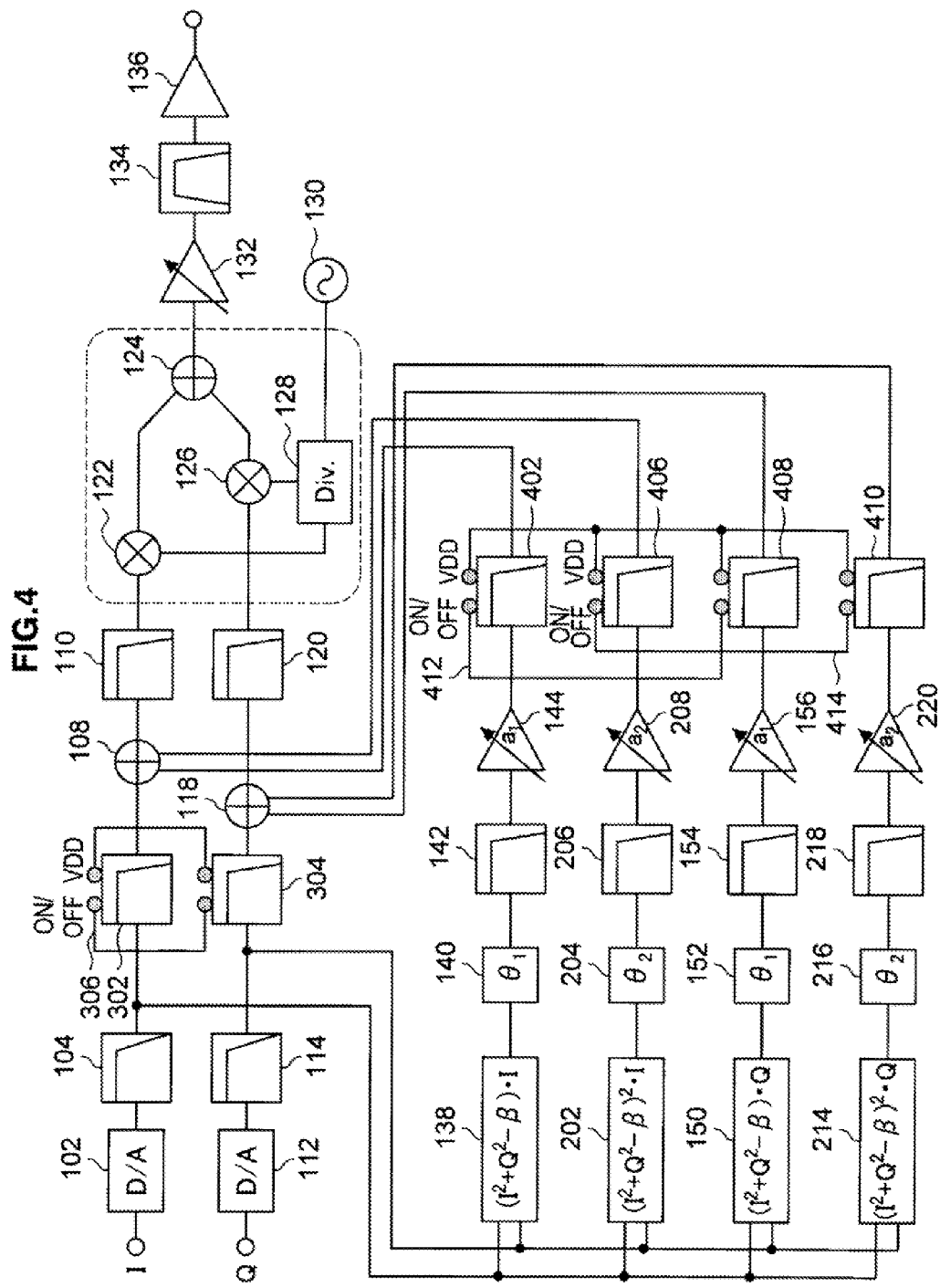
FIG. 4 shows a distortion compensator according to the fourth embodiment of the present invention.

The distortion compensator achieved in the fourth embodiment of the present invention is now explained. The same reference numerals are assigned to structural elements identical to those in the distortion compensators in the second and third embodiments explained earlier so as to preclude the necessity for a repeated explanation thereof and the following detailed explanation focuses on structural elements unique to the fourth embodiment. FIG. 4 is a block diagram showing the functional blocks constituting the distortion compensator in the fourth embodiment.

The distortion compensator in the second embodiment explained earlier includes the switches 212 and 224 through which the input control for the predistortion signals, to be used to cancel out the fifth-order distortion components in the analog orthogonal baseband signals having undergone the power amplification, is executed. In addition, the notable feature of the distortion compensator achieved in the third embodiment is that active band-pass filters are included as an alternative to the switch circuits. The distortion compensator in the fourth embodiment of the present invention to be explained next includes band-pass filters 406, 410, 402 and 408 in place of the switches 212, 224, 148 and 160 included in the distortion compensator in the second embodiment.

As shown in FIG. 4, the distortion compensator in the fourth embodiment includes band-pass filters 406 and 410 disposed in place of the switches 212 and 224 in the distortion compensator in the second embodiment (see FIG. 2).

A control unit 412 controls the ON/OFF states of the band-pass filters 402 and 408 and they are switched ON/OFF in response to a control signal PD2. Likewise, a control unit 414 controls the ON/OFF states of the band-pass filters 406 and 410 and they are switched ON/OFF in response to a control signal PD3. The control unit 414 executes control in response to the control signal (PD3) so as to set the bias current flowing through the band-pass filters 406 and 410 to zero when the band-pass filters 406 and 410 are in OFF state. Thus, the band-pass filters 406 and 410 are able to execute operation equivalent to the ON/OFF operation at the switches 212 and 224. This function enables selective input control for the predistortion signals, achieved by taking into consideration the fifth-order distortion component, as in the second embodiment. Then, based upon the output signal level, the predistortion signal input can be switched on/off. In addition, as in the third embodiment, the phase delay occurring in the predistortion signal generator that generates the predistortion signals to be used to compensate the fifth-order distortion component can be compensated.

An explanation has been given above on the structure adopted in the distortion compensator in the fourth embodiment by focusing on its differences from the distortion compensators in the second and third embodiments. Moreover, the structure that includes active band-pass filters 406, 410, 402 and 408 replacing the switches 212, 224, 148 and 160, disposed at the stages preceding the adders 108 and 118 for predistortion input control has been explained. However, the distortion compensator in the fourth embodiment is not limited to this structural example. For instance, buffer circuits that utilize operational amplifiers and the like may be used instead of the active band-pass filters.

Fifth Embodiment of the Present Invention

Figure 5:
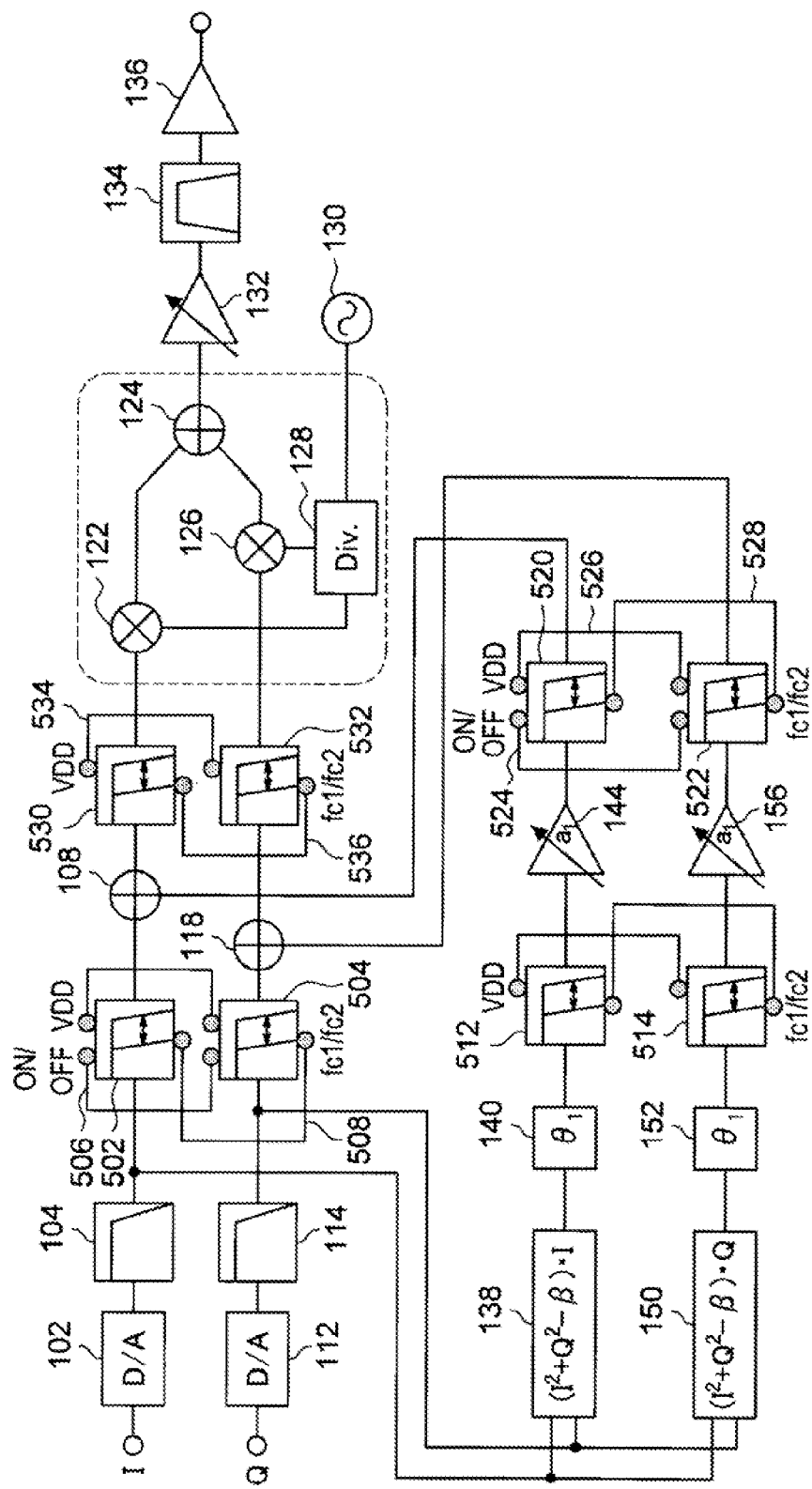
FIG. 5 shows a distortion compensator according to the fifth embodiment of the present invention.

The distortion compensator achieved in the fifth embodiment of the present invention is now explained. The same reference numerals are assigned to structural elements identical to those in the distortion compensator in the third embodiment explained earlier so as to preclude the necessity for a repeated explanation thereof and the following detailed explanation focuses on structural elements unique to the fifth embodiment. FIG. 5 is a block diagram showing the functional blocks constituting the distortion compensator in the fifth embodiment.

As shown in FIG. 5, the distortion compensator in the fifth embodiment of the present invention includes band-pass filters similar to the band-pass filters 302, 304, 310 and 312 (see FIG. 3) in the distortion compensator in the third embodiment explained earlier except that the cutoff frequencies of the band-pass filters in the fifth embodiment are variable. In addition, the distortion compensator in the fifth embodiment shown in FIG. 5 includes active band-pass filters 530, 532, 512 and 514 with variable cut off frequencies, respectively replacing the band-pass filters 110, 120, 142 and 154.

The ON/OFF operation of active band-pass filters 502 and 504 is controlled by a control unit 506 in response to a control signal (PD1). In addition, the cutoff frequencies of the active band-pass filters 502 and 504 are controlled by a control unit 508 in response to a control signal (BW1). Likewise, the cutoff frequencies of the active band-pass filters 530 and 532 are controlled by a control unit 536 in response to a control signal (BW2). In addition, the ON/OFF operation of active band-pass filters 520 and 522 are controlled by a control unit 524 in response to a control signal (PD2). Also, the cutoff frequencies of the active band-pass filters 520 and 522 are controlled by a control unit 528 in response to a control signal (BW4). It is to be noted that the individual active band-pass filters may be controlled in response to the corresponding control signals independently of one another or the plurality of active band-pass filters may operate by interlocking with one another.

The distortion compensator in the fifth embodiment described above allows the cutoff frequency of the target signal to be raised to a level close to the limit of the allowable range for the out-of-band noise. As a result, even in applications imposing rigorous restrictions, e.g., multiband applications, the optimal distortion compensation function can be selected.

Sixth Embodiment of the Present Invention

Figure 6:
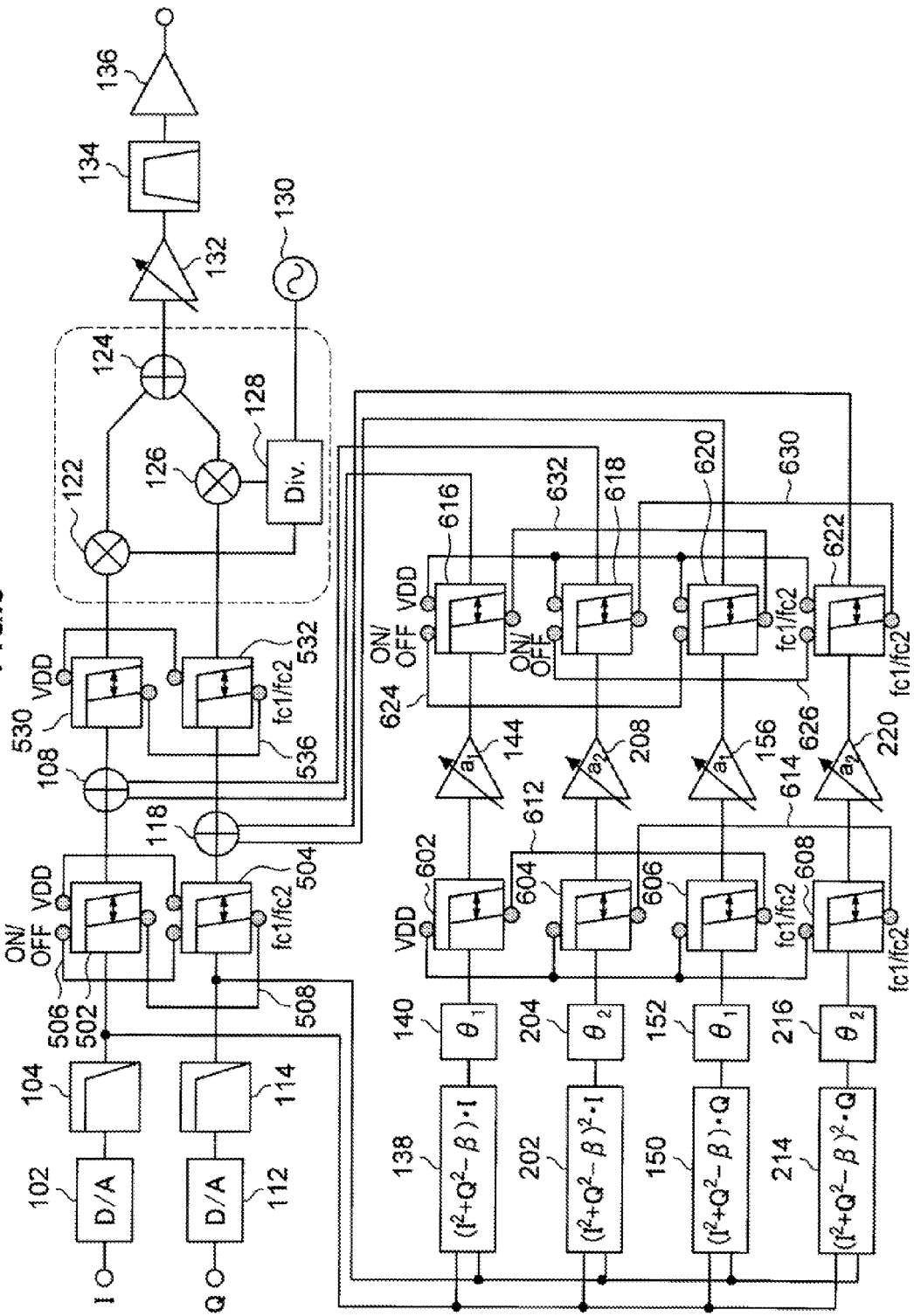
FIG. 6 shows a distortion compensator according to the sixth embodiment of the present invention.

The distortion compensator achieved in the sixth embodiment of the present invention is now explained. The same reference numerals are assigned to structural elements identical to those in the distortion compensators in the fourth and fifth embodiments explained earlier so as to preclude the necessity for a repeated explanation thereof and the following detailed explanation focuses on structural elements unique to the sixth embodiment. FIG. 6 is a block diagram showing the functional blocks constituting the distortion compensator in the sixth embodiment.

As shown in FIG. 6, the distortion compensator in the sixth embodiment of the present invention, which adopts functional features substantially identical to those of the distortion compensator in the fifth embodiment explained earlier, also allows band-pass filters similar to the band-pass filters 402, 406, 408 and 410 in the distortion compensator in the fourth embodiment (see FIG. 4) to assume a variable pass band (cut off frequencies). Namely, while the distortion compensator in the fifth embodiment adopts a functional structure that enables control of up to the third-order distortion component, the distortion compensator in the sixth embodiment adopts a functional structure that enables control of up to the fifth-order distortion component.

The cutoff frequencies of the active band-pass filters 602 and 606 are controlled by a control unit 612 in response to a control signal (BW3). Likewise, the cutoff frequencies of the active band-pass filters 604 and 608 are controlled by a control unit 614 in response to a control signal (BW5). In addition, the ON/OFF operation of active band-pass filters 616 and 620 is controlled by a control unit 624 in response to a control signal (PD2). Also, the ON/OFF operation of active band-pass filters 618 and 622 is controlled by a control unit 626 in response to a control signal (PD3). It is to be noted that the individual active band-pass filters may be controlled in response to the corresponding control signals independently of one another or the plurality of active band-pass filters may operate by interlocking with one another.

The distortion compensator adopting the structure described above allows the cutoff frequency of the target signal to be raised to a level close to the limit of the allowable range for the out-of-band noise. As a result, even in applications imposing rigorous restrictions, e.g., multiband applications, the optimal distortion compensation function can be selected. In addition, since control of the fifth-order distortion component is enabled, an even higher level of accuracy is assured with regard to the distortion compensation effect over that achieved in the fifth embodiment.

Seventh Embodiment of the Present Invention

Figure 7:
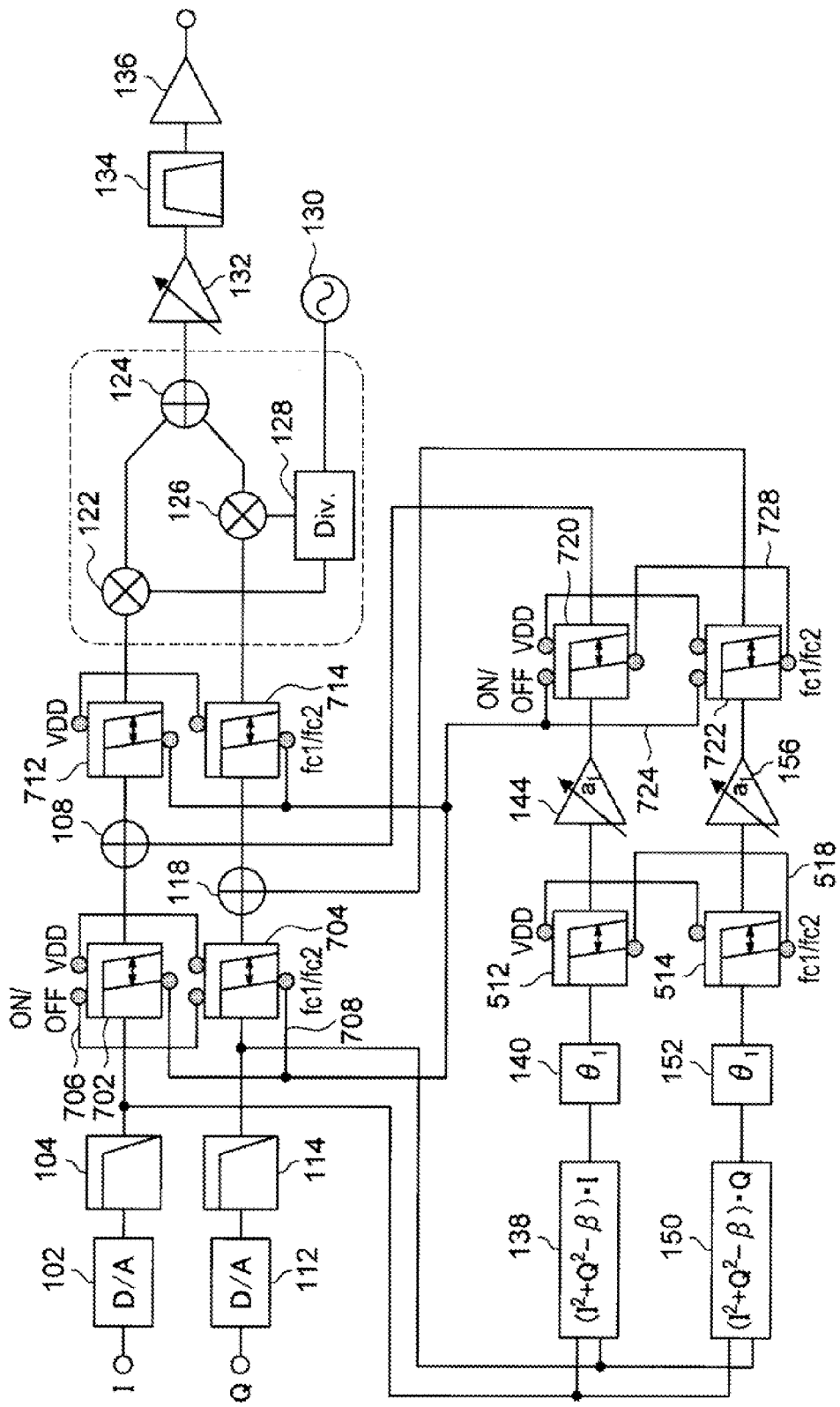
FIG. 7 shows a distortion compensator according to the seventh embodiment of the present invention.

The distortion compensator achieved in the seventh embodiment of the present invention is now explained. The same reference numerals are assigned to structural elements identical to those in the distortion compensator in the fifth embodiment explained earlier so as to preclude the necessity for a repeated explanation thereof and the following detailed explanation focuses on structural elements unique to the seventh embodiment. FIG. 7 is a block diagram showing the functional blocks constituting the distortion compensator in the seventh embodiment.

The distortion compensator achieved in the seventh embodiment allows pass band control for active band-pass filters 702, 704, 712 and 714 and ON/OFF control for active band-pass filters 720 and 722, the ON/OFF operations of which can be controlled, to be executed by interlocking with each other. It is to be noted that the pass band control and the ON/OFF control are executed based upon a control signal (PD2).

Figure 11:
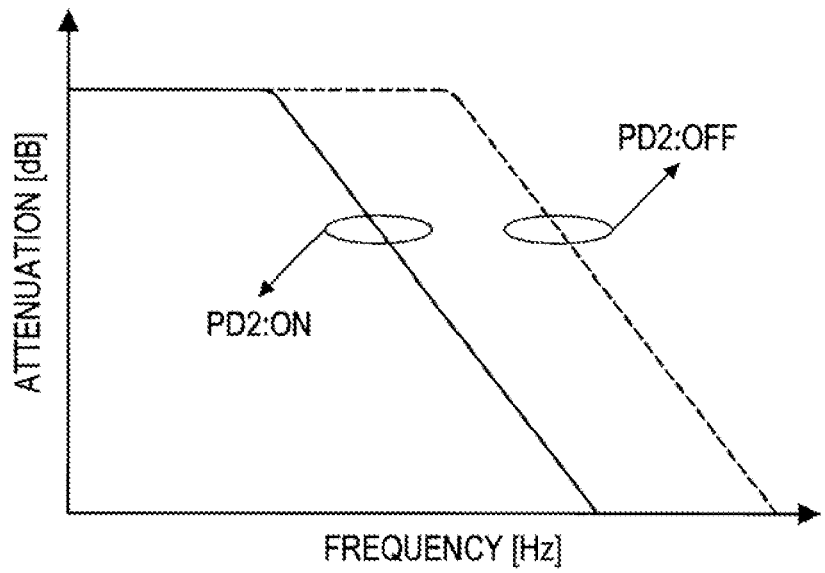
FIG. 11 shows a pass band control method that may be adopted in an active band-pass filter in conjunction with the predistortion signal input control executed in the seventh and eighth embodiments.
Figure 12:
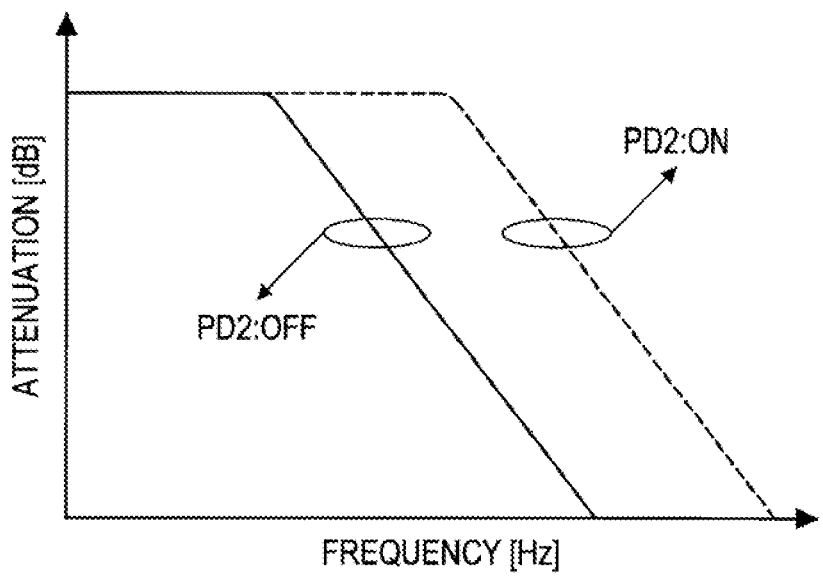
FIG. 12 shows a pass band control method that may be adopted in an active band-pass filter in conjunction with the predistortion signal input control executed in the seventh and eighth embodiments.

FIG. 11 illustrates how the pass band at the active band-pass filters 702 and 704 may change in response to ON/OFF operation at the active band-pass filters 720 and 722, whereas FIG. 12 illustrates how the pass band at the active band-pass filters 712 and 714 may change in response to ON/OFF operation at the active band-pass filters 720 and 722.

As shown in FIG. 11, the active band-pass filters 702 and 704 lower their cutoff frequency as the predistortion signal input is switched on (PD2: ON) so as to match the phase of the predistortion signal with the phase of the analog orthogonal baseband signal. At the lowered cutoff frequency, the phase delay occurring at the active band-pass filters 512 and 514 can be compensated. When the predistortion signal input is switched off (PD2: OFF), it is not strictly necessary to compensate the phase delay occurring at the active band-pass filters 512 and 514 and, accordingly, the active band-pass filters 702 and 704 raise their cutoff frequency. In addition, as the predistortion signal input is switched off (PD2: OFF), the active band-pass filters 712 and 714 lower their cutoff frequency so as to remove the noise component generated in the adders 108 and 118. It is to be noted that the cutoff frequencies at the active band-pass filters 512, 514, 720 and 722 are controlled in correspondence to the levels of noise occurring in the phase shifters 140 and 152 and the gain moderators 144 and 156.

The distortion compensator in the seventh embodiment of the present invention structured as described above has a function whereby the predistortion signal input control is allowed to interlock with pass band control processing for the analog orthogonal baseband signal and the pass band control processing for the target signal. This function makes it possible to reduce the power consumption through the predistortion signal input control and, at the same time, enables optimal adjustment of the frequency band of the target signal so as to reduce the out-of-band noise.

Eighth Embodiment of the Present Invention

Figure 8:
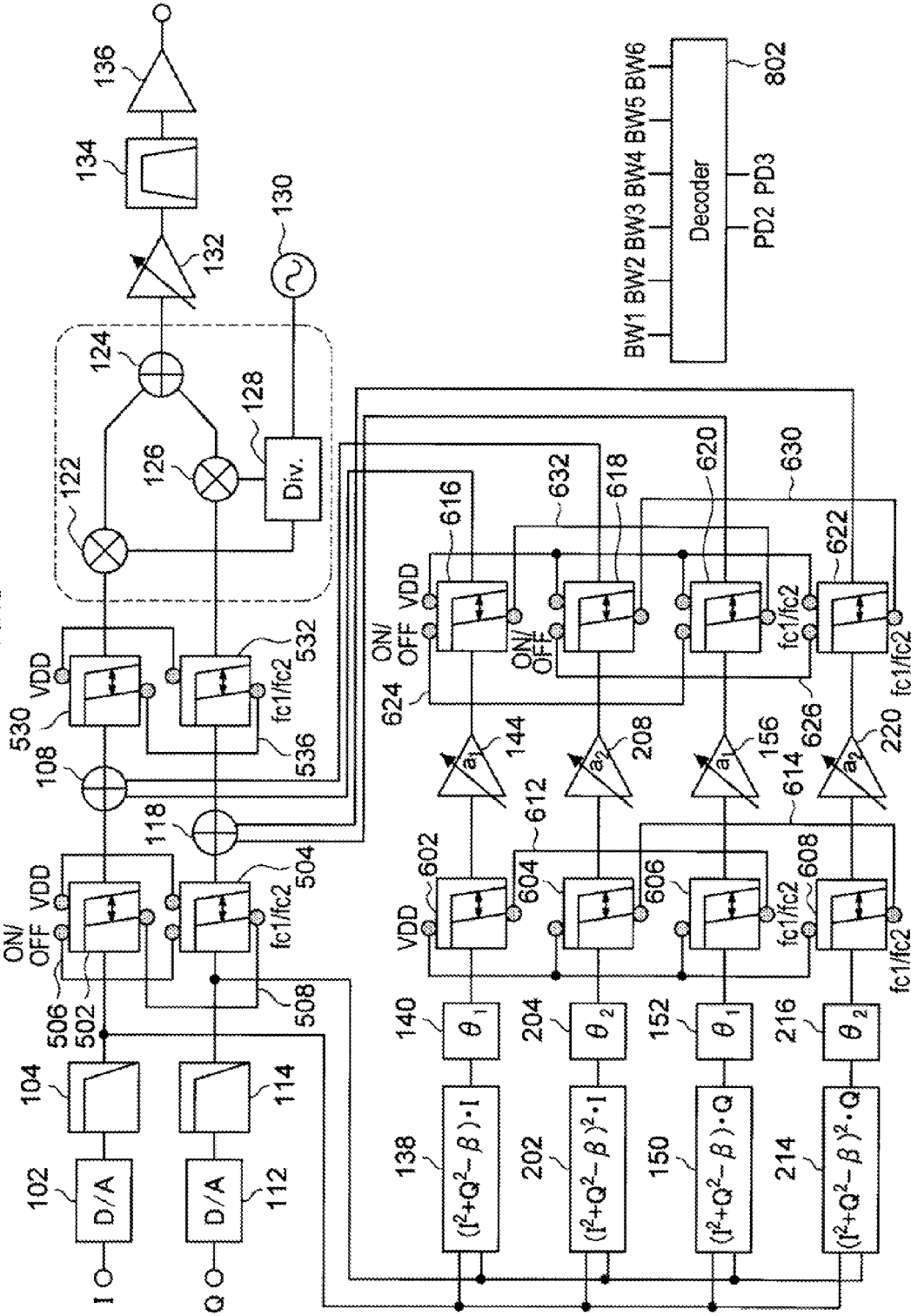
FIG. 8 shows a distortion compensator according to the eighth embodiment of the present invention.

The distortion compensator achieved in the eighth embodiment of the present invention is now explained. The same reference numerals are assigned to structural elements identical to those in the distortion compensators in the sixth and seventh embodiments explained earlier so as to preclude the necessity for a repeated explanation thereof and the following detailed explanation focuses on structural elements unique to the eighth embodiment. FIG. 8 is a block diagram showing the functional blocks constituting the distortion compensator in the eighth embodiment.

The distortion compensator achieved in the eighth embodiment allows pass band control for active band-pass filters 502, 504, 530 and 532 and ON/OFF control for active band-pass filters 616, 618, 620 and 622, the ON/OFF operations of which can be controlled, to be executed by interlocking with each other. It is to be noted that the pass band control and the ON/OFF control are executed based upon control signals (PD2 and PD3).

While the distortion compensator in the eighth embodiment adopts a structure substantially similar to that of the distortion compensator achieved in the sixth embodiment, it differs from the distortion compensator in the sixth embodiment in that it includes a decoder 802, which allows the pass band control for the active band-pass filters 502, 504, 530 and 532 and the ON/OFF control for the active band-pass filters 616, 618, 620 and 622, the ON/OFF operations of which can be controlled, to interlock with each other via control signals (PD1, PD2; BW1, BW2, BW3, BW4, BW5, BW6) used to control the individual active band-pass filters. In addition, the distortion compensator in the eighth embodiment differs from the distortion compensator in the seventh embodiment in that it generates predistortion signals to be used for fifth-order distortion component control. It is to be noted that since the control signal PD2 and the control signal PD3 are controlled independently of each other, the decoder 802 is able to control the pass bands at the active band-pass filters 502, 504, 530 and 532 in correspondence to a specific combination of PD2 and PD3.

The distortion compensator in the eighth embodiment of the present invention structured as described above has a function whereby the predistortion signal input control is allowed to interlock with pass band control processing for the analog orthogonal baseband signal and the pass band control processing for the target signal. This function makes it possible to reduce the power consumption through the predistortion signal input control and, at the same time, enables optimal adjustment of the frequency band of the target signal so as to reduce the out-of-band noise.

Ninth Embodiment of the Present Invention

Figure 9:
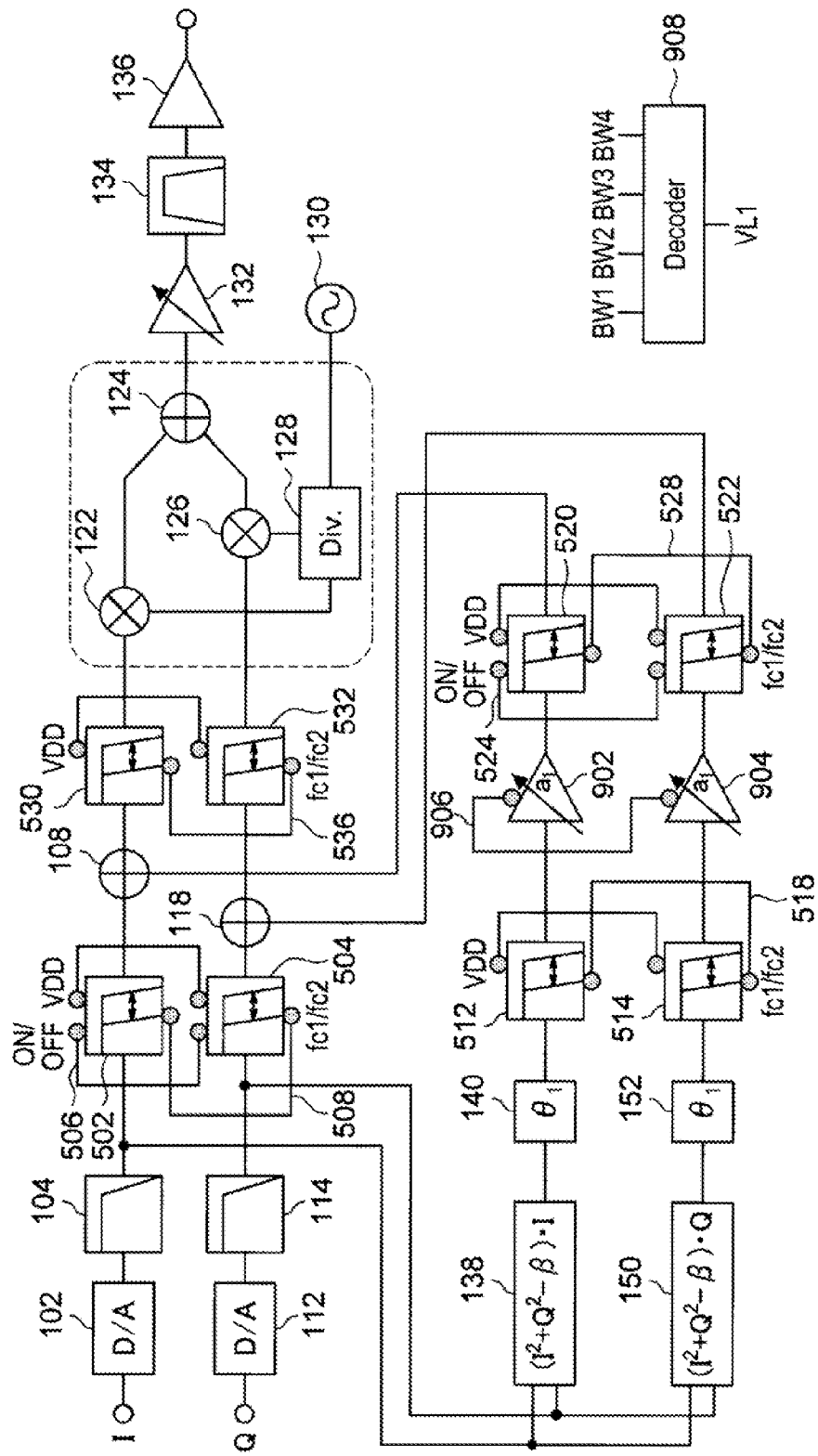
FIG. 9 shows a distortion compensator according to the ninth embodiment of the present invention.

The distortion compensator achieved in the ninth embodiment of the present invention is now explained. The same reference numerals are assigned to structural elements identical to those in the distortion compensator in the fifth embodiment explained earlier so as to preclude the necessity for a repeated explanation thereof and the following detailed explanation focuses on structural elements unique to the ninth embodiment. FIG. 9 is a block diagram showing the functional blocks constituting the distortion compensator in the ninth embodiment.

The distortion compensator in the ninth embodiment includes gain moderators 902 and 904 for which gain control can be executed in correspondence to a control signal (LV1), in place of the gain moderators 144 and 156 included in the distortion compensator in the fifth embodiment. The distortion compensator further includes a control unit 906 that controls the gain moderators 902 and 904 based upon the control signal LV1. In addition, the distortion compensator includes a decoder 908 that adjusts control signals BW1, BW2, BW3 and BW4 so as to adjust the cutoff frequencies at the active band-pass filters 502, 504, 512, 514, 520, 522, 530 and 532 by interlocking with the gain moderation value assumed for the gain moderators 902 and 904.

Figure 13:
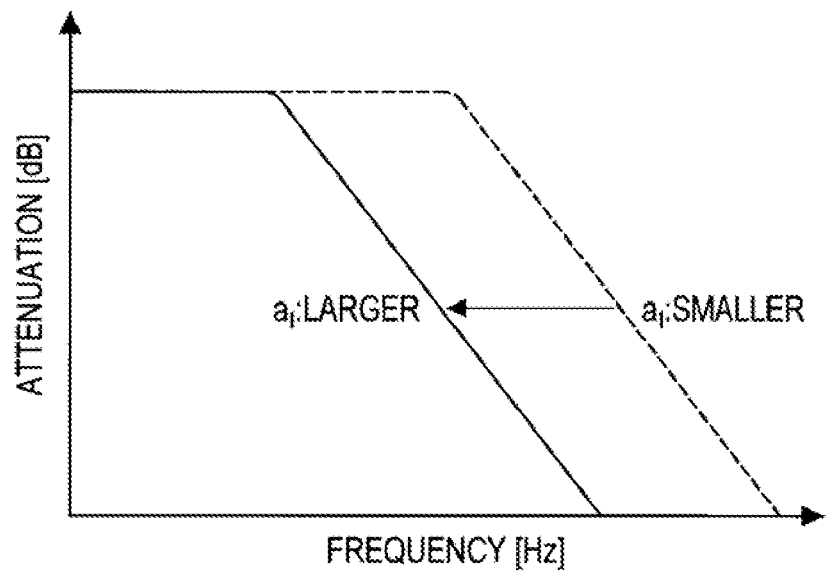
FIG. 13 shows a pass band control method that may be adopted in an active band-pass filter in conjunction with the predistortion signal amplitude ratio control executed in the ninth and tenth embodiments.
Figure 14:
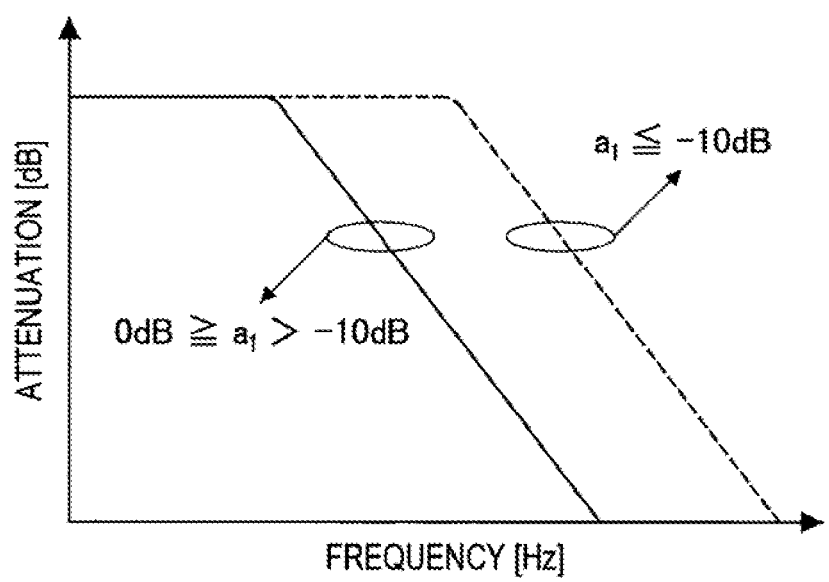
FIG. 14 shows a pass band control method that may be adopted in an active band-pass filter in conjunction with the predistortion signal amplitude ratio control executed in the ninth and tenth embodiments.

FIGS. 13 and 14 illustrate how the pass bands at the active band-pass filters 530 and 532 may change in correspondence to the gain moderation value assumed for the gain moderators 902 and 904. FIG. 13 shows an example in which the cutoff frequencies of the active band-pass filters 530 and 532 are lowered as the gain moderation value a1 at the gain moderators 902 and 904 increases. FIG. 14, on the other hand, illustrates how different cutoff frequency values are selected at the active band-pass filters 530 and 532 when the gain moderation value a1 at the gain moderators 902 and 904 is equal to or less than −10 dB and when the gain moderation value a1 is greater than −10 dB but is equal to or less than 0 dB. As demonstrated in the examples, the decoder 908 is capable of altering the cutoff frequency at the individual active band-pass filters either continuously or in steps, in correspondence to the gain moderation value assumed at the gain moderators 902 and 904.

By using the distortion compensator in the ninth embodiment of the present invention achieving the functions described above, the cutoff frequencies at the various active band-pass filters can be lowered to reduce the adverse effect of the out-of-band noise in an ideal manner when the amplitude of the third-order distortion component in the target signal having undergone the power amplification is relatively large.

Tenth Embodiment of the Present Invention

Figure 10:
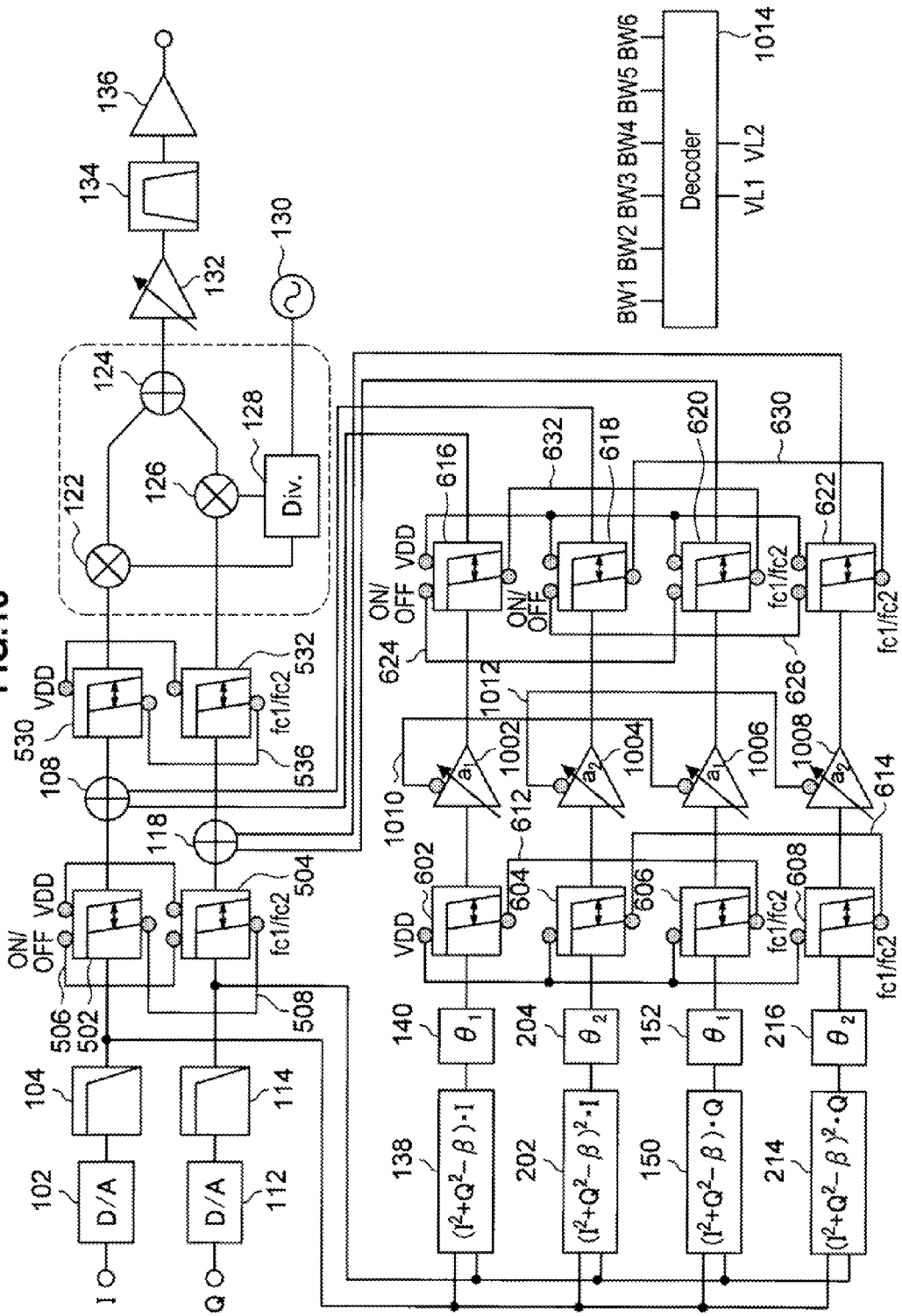
FIG. 10 shows a distortion compensator according to the tenth embodiment of the present invention.

The distortion compensator achieved in the tenth embodiment of the present invention is now explained. The same reference numerals are assigned to structural elements identical to those in the distortion compensator in the sixth embodiment explained earlier so as to preclude the necessity for a repeated explanation thereof and the following detailed explanation focuses on structural elements unique to the tenth embodiment. FIG. 10 is a block diagram showing the functional blocks constituting the distortion compensator in the tenth embodiment.

The distortion compensator in the tenth embodiment includes gain moderators 1002, 1004, 1006 and 1008 for which gained control can be executed in correspondence to control signals (LV1 and LV2), in place of the gain moderators 144, 156, 208 and 220 included in the distortion compensator in the sixth embodiment. The distortion compensator further includes a control unit 1010 that controls the gain moderators 1002 and 1006 based upon the control signal LV1 and a control unit 1012 that controls the gain moderators 1004 and 1008 based upon the control signal LV2. In addition, the distortion compensator includes a decoder 1014 that adjusts control signals BW1, BW2, BW3, BW4, BW5 and BW6 so as to adjust the cutoff frequencies at the active band-pass filters 502, 504, 530, 532, 602, 604, 606, 608, 616, 618, 620 and 622 by interlocking with the gain moderation values assumed for the gain moderators 1002, 1004, 1006 and 1008.

The predistortion signal generator in the distortion compensator in the tenth embodiment is achieved by expanding the predistortion signal generator in the distortion compensator in the ninth embodiment so as to enable control on the fifth-order distortion component as well. Thus, as is the distortion compensator in the ninth embodiment, the distortion compensator in the tenth embodiment is capable of adjusting the cutoff frequencies at the individual active band-pass filters in correspondence to the relative amplitude ratio of the higher-order distortion component contained in the target signal resulting from the power amplification. In addition, the distortion compensator in the tenth embodiment, adopting a structure achieved by taking into consideration control on the fifth-order distortion component, is capable of executing distortion compensation with an even higher level of accuracy over the distortion compensator in the ninth embodiment.

By using the distortion compensator in the tenth embodiment of the present invention achieving the functions described above, the cutoff frequencies at the various active band-pass filters can be lowered to reduce the adverse effect of the out-of-band noise in an ideal manner when the amplitude of the third-order distortion component or the fifth-order distortion component in the target signal having undergone the power amplification is relatively large.

<Application to a Wireless Communication Device>

The preferred embodiments of the distortion compensator according to the present invention have been explained in detail above. Any of the distortion compensators in the embodiments described above may be installed and utilized in a wireless communication device, such as a cellular phone. Parts of the embodiments or variations thereof may be adopted in selective combinations in correspondence to the uses of specific modes of application.

Figure 15:
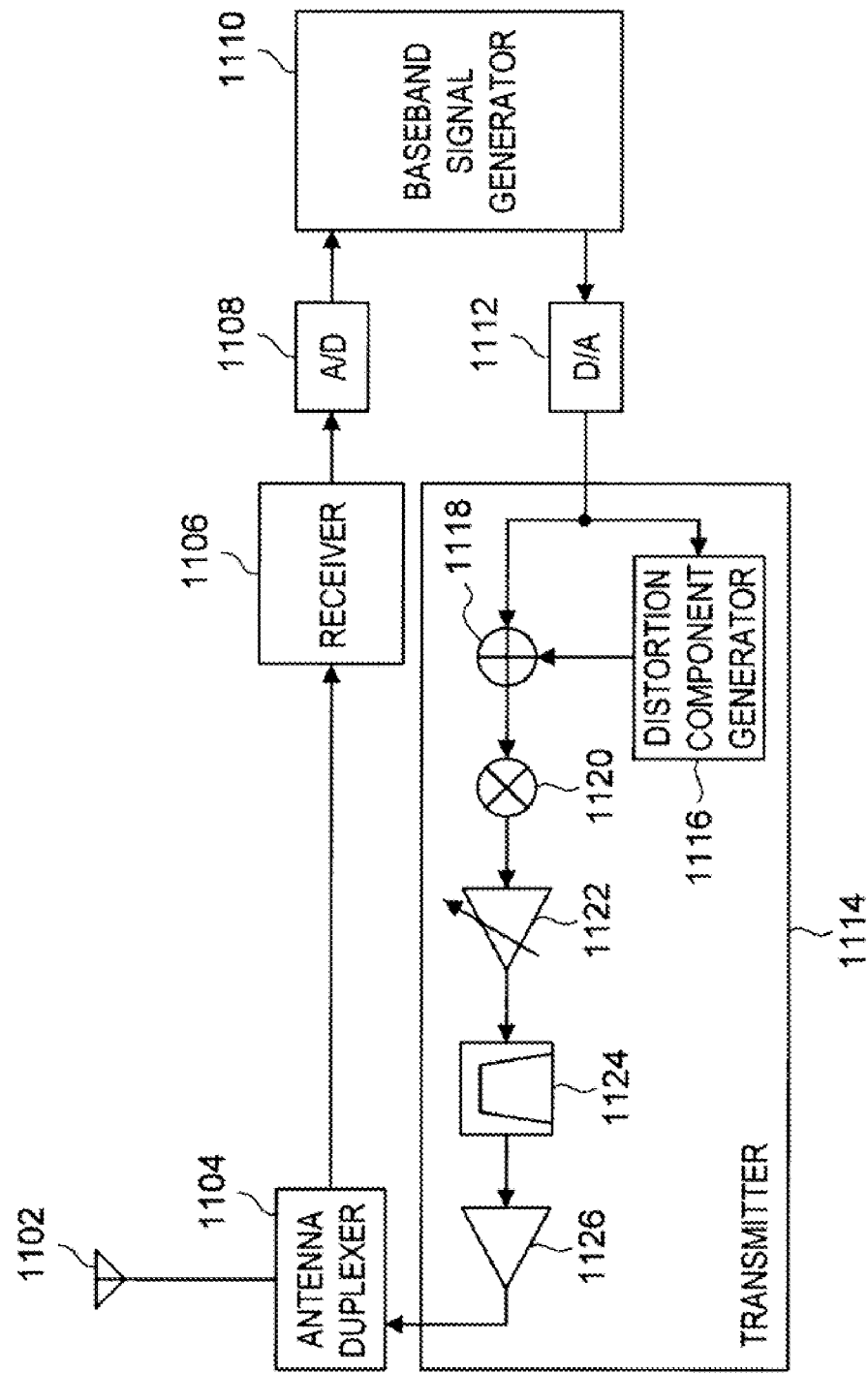
FIG. 15 shows a wireless communication device that may adopt any of the embodiments.

In reference to FIG. 15, a structural example of a wireless communication device in which the distortion compensator in an embodiment of the present invention may be adopted is explained.

The wireless communication device includes an antenna 1102, an antenna duplexer 1104, a receiver 1106, an analog-digital converter (ADC) 1108, a baseband signal generator 1110, a digital-analog converter (D-A converter) 1112 and a transmitter 1114. The transmitter 1114 includes a distortion component generator 1116, an adder 1118, a quadratic modulator 1120, a variable gain amplifier 1122, a band-pass filter 1124 and a power amplifier 1126. It is to be noted that the distortion compensator corresponds to the portion that includes the DAC 1112 and the transmitter 1114, and that the predistortion signal generator explained earlier corresponds to the distortion component generator 1116.

A high-frequency signal transmitted from another wireless communication device is received at the antenna 1102. In addition, a target signal generated at the transmitter 1114 is obtained via the antenna duplexer 1104 and is transmitted from the antenna 1102 to another wireless communication device. The antenna duplexer 1104 is an aerial multi-coupler through which the transmitter 1114 and the receiver 1106 are connected to the single antenna 1102. The receiver 1106 transfers an analog reception signal received via the antenna duplexer 1104 to the ADC 1108. The baseband signal generator 1110 obtains a demodulated baseband signal by demodulating the reception signal digitized via the ADC 1108.

The baseband signal generator 1110 generates a digital orthogonal baseband signal to be transmitted and transfers the digital orthogonal baseband signal having been generated to the transmitter 1114 via the DAC 1112. The transmitter 1114 branches the analog orthogonal baseband signal resulting from the analog conversion at the DAC 1112, inputs one of the branch signals to the adder 1118 and inputs the other branch signal to the distortion component generator 1116. The distortion component generator 1116 generates a predistortion signal based upon the analog orthogonal baseband signal input thereto and inputs the predistortion signal to the adder 1118. The adder 1118 combines the analog orthogonal baseband signal directly input from the DAC 1112 and the predistortion signal, thereby generating a target signal which is then input to the quadratic modulator 1120. The quadratic modulator 1120 executes quadrature modulation on the target signal and inputs the target signal having undergone the quadrature modulation to the variable gain amplifier 1122.

The target signal undergoes gain moderation at the variable gain amplifier 1122 and the target signal having undergone the gain moderation is input to the band-pass filter 1124. After a specific out-of-band frequency component is removed from the target signal at the band-pass filter 1124, the target signal is input to the power amplifier 1126. The power amplifier 1126 executes power amplification of the target signal and the target signal having undergone the power amplification is input to the antenna duplexer 1104. The target signal is subsequently transmitted to the other wireless communication device via the antenna duplexer 1104 and the antenna 1102.

It should be understood by those skilled in the art that various modifications, combinations, sub-combinations and alterations may occur depending on design requirements and other factors insofar as they are within the scope of the appended claims or the equivalents thereof.

What is claimed is:

1. A distortion compensator capable of compensating for a nonlinear distortion component occurring in the amplification of a target signal that is generated based upon an analog orthogonal base band signal, comprising:

a first band-pass filter that limits the frequency band of the analog orthogonal baseband signal input thereto;

a distortion component orthogonal baseband signal generator that generates a distortion component orthogonal baseband signal corresponding to the nonlinear distortion component based upon the analog orthogonal baseband signal having passed through the first band-pass filter;

an amplitude ratio moderator that moderates the amplitude of the distortion component orthogonal baseband signal so as to match the amplitude of the nonlinear distortion component with the amplitude of a signal obtained by amplifying the distortion component orthogonal baseband signal;

a phase difference moderator that moderates the phase of the distortion component orthogonal baseband signal so as to allow the nonlinear distortion component and the amplified distortion component orthogonal baseband signal to cancel each other out;

a distortion component synthesizer that generates the target signal by combining the analog orthogonal baseband signal and the distortion component orthogonal baseband signal having passed through the first band-pass filter; and a first switch by which control is executed as to whether or not to input the distortion component orthogonal baseband signal to the distortion component synthesizer.

2. A distortion compensator according to claim 1, further comprising:

a second band-pass filter that limits the frequency band of the distortion component orthogonal baseband signal having undergone amplitude moderation at the amplitude ratio moderator and having undergone phase moderation at the phase difference moderator.

3. A distortion compensator according to claim 1, further comprising:

a third band-pass filter that limits the frequency band of the target signal generated by the distortion component synthesizer.

4. A distortion compensator according to claim 1, further comprising:

a second switch through which control is executed as to whether or not to input the analog orthogonal baseband signal to the distortion component synthesizer.

5. A distortion compensator according to claim 1, further comprising:

a fourth band-pass filter that limits the frequency band of the analog orthogonal baseband signal input to the distortion component synthesizer, wherein:

the distortion compensator enables the fourth band-pass filter to function as the first switch by switching ON/OFF the fourth band-pass filter.

6. A distortion compensator according to claim 2, wherein:
the frequency band of the distortion component orthogonal baseband signal allowed to pass through the second band-pass filter is variable.

7. A distortion compensator according to claim 3, wherein:
the frequency band of the target signal allowed to pass through the third band-pass filter is variable.

8. A distortion compensator according to claim 5, wherein:
the frequency band of the analog orthogonal baseband signal allowed to pass through the fourth band-pass filter is variable.

9. A distortion compensator according to claim 7, wherein:
the third band-pass filter alters the frequency band that is allowed to pass by interlocking with an ON/OFF operation at the first switch.

10. A distortion compensator according to claim 8, wherein:
the fourth band-pass filter alters the frequency band that is allowed to pass by interlocking with an ON/OFF operation at the first switch.

11. A distortion compensator according to claim 6, wherein:
the second band-pass filter alters the frequency band that is allowed to pass in correspondence to an amplitude of the distortion component orthogonal baseband signal having been moderated at the amplitude ratio moderator.

12. A distortion compensator according to claim 7, wherein:
the third band-pass filter alters the frequency band that is allowed to pass in correspondence to the amplitude of the distortion component orthogonal baseband signal having been moderated at the amplitude ratio moderator.

13. A distortion compensator according to claim 8, wherein:
the fourth band-pass filter alters the frequency band that is allowed to pass in correspondence to the amplitude of the distortion component orthogonal baseband signal having been moderated at the amplitude ratio moderator.

14. A distortion compensator capable of compensating for a nonlinear distortion component occurring in the amplification of a target signal that is generated based upon an analog orthogonal base band signal, comprising:
a first band-pass filter that limits the frequency band of the analog orthogonal baseband signal input thereto;
a distortion component orthogonal baseband signal generator that generates a distortion component orthogonal baseband signal corresponding to the nonlinear distortion component based upon the analog orthogonal baseband signal having passed through the first band-pass filter;
an amplitude ratio moderator that moderates the amplitude of the distortion component orthogonal baseband signal so as to match the amplitude of the nonlinear distortion component with the amplitude of a signal obtained by amplifying the distortion component orthogonal baseband signal;
a phase difference moderator that moderates the phase of the distortion component orthogonal baseband signal so as to allow the nonlinear distortion component and the amplified distortion component orthogonal baseband signal to cancel each other out;

a second band-pass filter that limits the frequency band of the distortion component orthogonal baseband signal having undergone amplitude ratio moderation at the amplitude ratio moderator and having undergone phase moderation at the phase difference moderator; and a distortion component synthesizer that generates the target signal by combining the analog orthogonal baseband signal having passed through the first band-pass filter and the distortion component orthogonal baseband signal having passed through the amplitude ratio moderator and the phase difference moderator, wherein:

the distortion compensator executes control with regard to whether or not to input the distortion component orthogonal baseband signal to the distortion component synthesizer by switching ON/OFF the second band-pass filter.

15. A distortion compensator according to claim 14, further comprising:
a third band-pass filter that limits the frequency band of the target signal having been generated by the distortion component synthesizer.

16. A distortion compensator according to claim 14, further comprising:
a switch through which control is executed as to whether or not to input the analog orthogonal baseband signal to the distortion component synthesizer.

17. A distortion compensator according to claim 14, further comprising:
a fourth band-pass filter that limits the frequency band of the analog orthogonal baseband signal input to the distortion component synthesizer, wherein:
the distortion compensator executes control as to whether or not to input the analog orthogonal baseband signal to the distortion component synthesizer by switching ON/OFF the fourth band-pass filter.

18. A distortion compensator according to claim 14, wherein:
the frequency band of the distortion component orthogonal baseband signal allowed to pass through the second band-pass filter is variable.

19. A distortion compensator according to claim 15, wherein:
the frequency band of the target signal allowed to pass through the third band-pass filter is variable.

20. A distortion compensator according to claim 17, wherein:
the frequency band of the analog orthogonal baseband signal allowed to pass through the fourth band-pass filter is variable.

21. A distortion compensator according to claim 19, wherein:
the third band-pass filter alters the frequency band that is allowed to pass by interlocking with an ON/OFF operation at the second band-pass filter.

22. A distortion compensator according to claim 20, wherein:
the fourth band-pass filter alters the frequency band that is allowed to pass by interlocking with an ON/OFF operation at the second band-pass filter.

23. A distortion compensator according to claim 18, wherein:
the second band-pass filter alters the frequency band that is allowed to pass in correspondence to the amplitude of the distortion component orthogonal baseband signal having been moderated at the amplitude ratio moderator.

24. A distortion compensator according to claim 19, wherein:

the third band-pass filter alters the frequency band that is allowed to pass in correspondence to the amplitude of the distortion component orthogonal baseband signal having been moderated at the amplitude ratio moderator.

25. A distortion compensator according to claim 20, wherein:

the fourth band-pass filter alters the frequency band that is allowed to pass in correspondence to the amplitude of the distortion component orthogonal baseband signal having been moderated at the amplitude ratio moderator.

* * * * *